US012694917B2

(12) United States Patent
Ootera et al.

(10) Patent No.: US 12,694,917 B2
(45) Date of Patent: Jul. 28, 2026

(54) MAGNETIC MEMORY AND MANUFACTURING METHOD USING FIELD LINE AND BIT LINE CONSTRUCTION

(71) Applicant: Kioxia Corporation, Tokyo (JP)

(72) Inventors: Yasuaki Ootera, Yokohama (JP);
Tsutomu Nakanishi, Yokohama (JP);
Nobuyuki Umetsu, Kawasaki (JP);
Tomoe Nishimura, Yokohama (JP);
Susumu Hashimoto, Tokyo (JP);
Masaki Kado, Kamakura (JP);
Tsuyoshi Kondo, Kawasaki (JP)

(73) Assignee: Kioxia Corporation, Tokyo (JP)

( * ) Notice: Subject to any disclaimer, the term of this patent is extended or adjusted under 35 U.S.C. 154(b) by 311 days.

(21) Appl. No.: 18/461,304

(22) Filed: Sep. 5, 2023

(65) Prior Publication Data

US 2024/0221809 A1 Jul. 4, 2024

(30) Foreign Application Priority Data

Dec. 21, 2022 (JP) ................................. 2022-204806

(51) Int. Cl.
*G11C 11/16* (2006.01)
*G11C 11/155* (2006.01)
(Continued)

(52) U.S. Cl.
CPC .......... *G11C 11/161* (2013.01); *G11C 11/155* (2013.01); *G11C 11/1655* (2013.01); *G11C 11/1673* (2013.01); *G11C 11/1675* (2013.01); *G11C 11/5607* (2013.01); *H10B 61/22*

(2023.02); *H10N 50/01* (2023.02); *H10N 50/10* (2023.02); *H10N 50/80* (2023.02)

(58) Field of Classification Search
CPC . G11C 11/161; G11C 11/155; G11C 11/1655; G11C 11/1673; G11C 11/1675; G11C 11/5607; H10B 61/22; H10N 50/01; H10N 50/10; H10N 50/80
See application file for complete search history.

(56) References Cited

U.S. PATENT DOCUMENTS

| | | |
|---|---|---|
| 11,101,012 B2 | 8/2021 | Ueda |
| 2016/0056205 A1* | 2/2016 | Nakamura .......... G11C 11/1673 |
| | | 257/421 |

(Continued)

FOREIGN PATENT DOCUMENTS

| | | |
|---|---|---|
| JP | 2019033121 A | 2/2019 |
| JP | 2020155178 A | 9/2020 |

(Continued)

*Primary Examiner* — Donald HB Braswell
(74) *Attorney, Agent, or Firm* — Kim & Stewart LLP

(57) ABSTRACT

According to one embodiment, a magnetic memory includes first magnetic members extending in a first direction, first wirings extending in a second direction and spaced from each other in a third direction, and a second magnetic member. The second magnetic member has a first portion above the first wirings, a second portion extending in the second direction between adjacent first wirings, a third portion below the plurality of first wirings, and a fourth portion with a part inside an upper end portion of a first magnetic member. A third wiring extends in the third direction and is connected to lower end portions of first magnetic members.

19 Claims, 17 Drawing Sheets

(51) Int. Cl.
| | |
|---|---|
| *G11C 11/56* | (2006.01) |
| *H10B 61/00* | (2023.01) |
| *H10N 50/01* | (2023.01) |
| *H10N 50/10* | (2023.01) |
| *H10N 50/80* | (2023.01) |

(56) References Cited

U.S. PATENT DOCUMENTS

| | | | | |
|---|---|---|---|---|
| 2020/0294610 A1* | 9/2020 | Takada | ................. | G11C 11/1675 |
| 2020/0303457 A1* | 9/2020 | Ootera | ................... | H10N 50/80 |
| 2021/0280635 A1* | 9/2021 | Tokuhira | ................ | H10N 50/80 |
| 2022/0302208 A1* | 9/2022 | Nakanishi | ............. | G11C 11/161 |
| 2023/0076828 A1* | 3/2023 | Shimomura | ........... | H10N 50/80 |
| 2023/0180484 A1* | 6/2023 | Nakamura | ............ | G11C 11/161 |
| | | | | 257/421 |
| 2023/0309321 A1 | 9/2023 | Shimomura | | |
| 2024/0055028 A1* | 2/2024 | Umetsu | ............... | G11C 11/1675 |

FOREIGN PATENT DOCUMENTS

| | | | |
|---|---|---|---|
| JP | 6886888 | B2 | 6/2021 |
| JP | 2021141250 | A | 9/2021 |

* cited by examiner

*FIG. 2*

MAGNETIC MEMORY AND MANUFACTURING METHOD USING FIELD LINE AND BIT LINE CONSTRUCTION

CROSS-REFERENCE TO RELATED APPLICATION(S)

This application is based upon and claims the benefit of priority from Japanese Patent Application No. 2022-204806, filed Dec. 21, 2022, the entire contents of which are incorporated herein by reference.

FIELD

Embodiments described herein relate generally to a magnetic memory and a manufacturing method of the same.

BACKGROUND

A magnetic memory is known in which a magnetic wall of a magnetic member is moved (shifted) by passing a current through the magnetic member. In such a magnetic memory, the writing of information to the magnetic member is performed by passing a current through a field line and generating a magnetic field in a yoke with the current. However, it is difficult to miniaturize a yoke structure in related art.

BRIEF DESCRIPTION OF THE DRAWINGS

FIG. 2 is a schematic cross-sectional view taken along line A-A shown in FIG. 1.

DETAILED DESCRIPTION

In general, according to one embodiment, a magnetic memory includes a plurality of first magnetic members, each extending in a first direction and having a first end portion and a second end portion. A plurality of first wirings extend in a second direction intersecting the first direction and are spaced from each other in a third direction intersecting the first and second directions. The second end portion of one of the plurality of first magnetic members is between adjacent first wirings in plan view from the first direction. A second magnetic member has a first portion above the plurality of first wirings in the first direction, a second portion extending in the second direction between adjacent first wirings and electrically coupled to the first portion, a third portion below the plurality of first wirings in the first direction, and a fourth portion with a part inside the second end portion of the one of the plurality of first magnetic members and electrically coupled to the second portion. A third wiring extends in the third direction and is electrically coupled to the first end portions of at least one of the plurality of first magnetic members.

Hereinafter, certain example embodiments of the present disclosure will be described with reference to the drawings. The present disclosure is not limited to the specific example embodiments described. The drawings are schematic and/or conceptual. In the specification and drawings, the same elements are denoted by the same reference symbols.

First Embodiment

Figure 1:
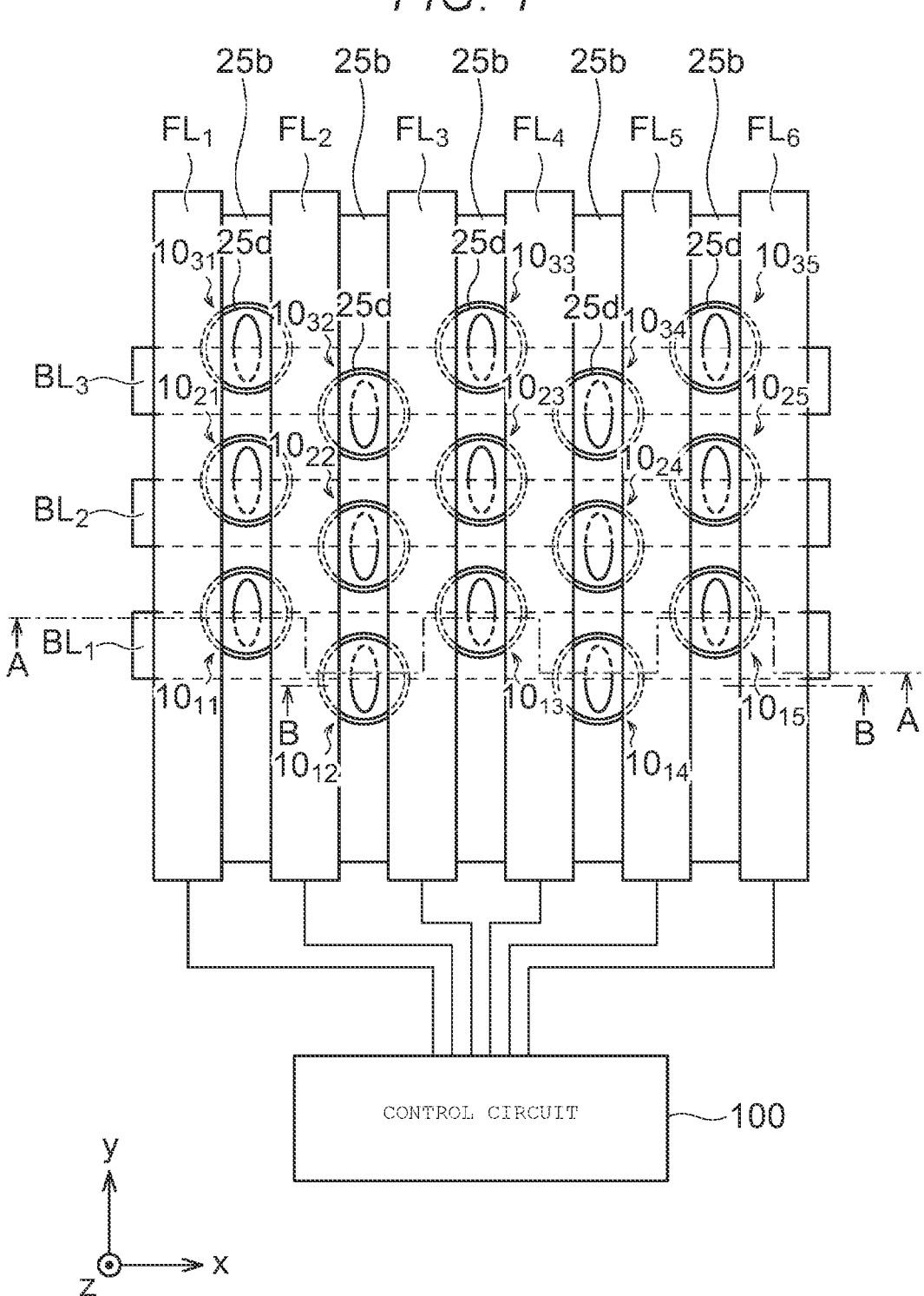
FIG. 1 is a schematic plan view of a magnetic memory according to a first embodiment.
Figure 2:
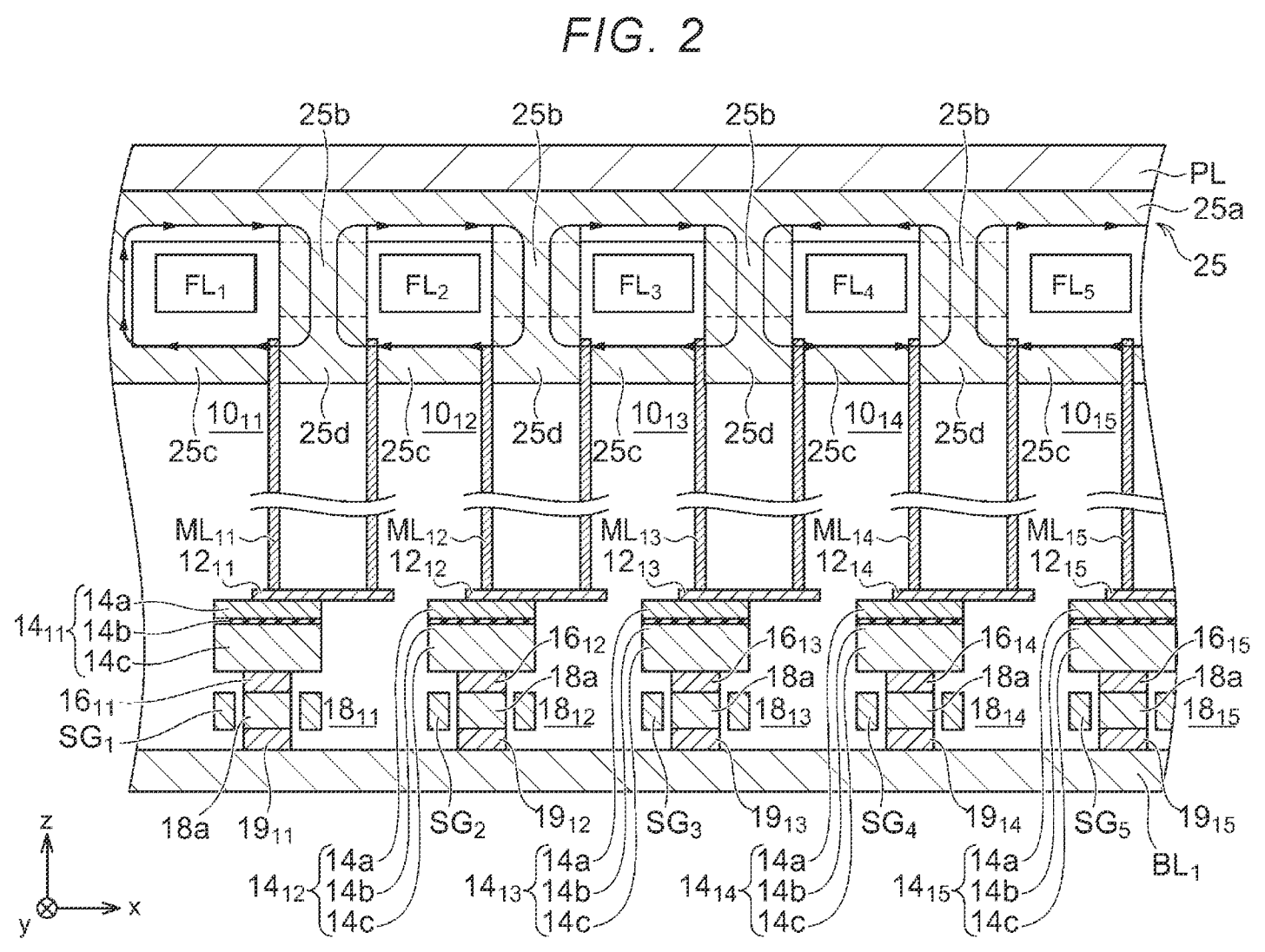

FIG. 1 is a schematic plan view of a magnetic memory according to the first embodiment. FIG. 2 is a schematic cross-sectional view taken along line A-A shown in FIG. 1. The magnetic memory of the first embodiment includes a memory unit $10_{ij}$ (i=1 to m, j=1 to n) disposed in m rows and n columns, where m and n are natural numbers. FIG. 1 shows the memory units $10_{11}$ to $10_{35}$ arranged in 3 rows and 5 columns.

The memory units $10_{i1}$ to $10_{in}$ in the i-th row are disposed along a bit line $BL_i$ extending in an x direction. A first end portion (11a in FIG. 3) of each memory unit $10_{i1}$ to $10_{in}$ is electrically coupled to the bit line $BL_i$. In the present specification, "A and B are electrically coupled" means that A and B may be directly connected or may be indirectly connected via a conductor or the like. In the i-th row, the memory units ($10_{i1}$, $10_{i3}$, . . . ) of odd-numbered columns are offset from the memory units ($10_{i2}$, $10_{i4}$, . . . ) of even-numbered columns in a y direction (the up-down page direction in FIG. 1). For example, the memory unit $10_{i2}$ in an even-numbered column is provided between the memory unit $10_{i1}$ and the memory unit $10_{i3}$ in the odd-numbered columns, and is offset in the −y direction the adjacent memory units in the odd-numbered columns. By using such a disposition, a plurality of memory units can be more densely disposed.

Two field lines $FL_j$ and $FL_{j+1}$ (j=1 to n−1) are provided for each of the memory units $10_{ij}$ to $10_{mj}$ disposed in a j-th column. In plan view in the z direction, the memory units $10_{ij}$ to $10_{mj}$ are positioned between the field line $FL_j$ and the field line $FL_{j+1}$. The field line $FL_{j+1}$ may overlap a portion of each of the memory units $10_{ij}$ in the j-th column and overlap a portion of each of the memory units $10_{ij+1}$ in the j+1-th column in plan view. As shown in FIG. 2, the field line $FL_{j+1}$ is disposed above (in the +z direction) the area between the memory unit $10_{ij}$ in the j-th column and the memory unit $10_{ij+1}$ in the j+1-th column.

For example, the field line $FL_2$ and the field line $FL_3$ are provided for the memory unit $10_{i2}$ disposed in the second column. The memory unit $10_{i2}$ is positioned between the field line $FL_2$ and the field line $FL_3$ in plan view in the z direction. The field line $FL_2$ may overlap a portion of each of the memory units $10_{i1}$ in the first column and overlap a portion of each of the memory units $10_{i2}$ in the second column in plan view in the z direction. As shown in FIG. 2, the field line $FL_2$ is disposed above the area between the memory unit $10_{i1}$ of the first column and the memory unit $10_{i2}$ of the second column.

The field lines $FL_j$ (j=1 to n+1) extend along the y direction and are disposed adjacent to each other in the x direction. The field line $FL_j$ intersects the bit line $BL_i$ extending in the x direction. Each of the field lines $FL_j$ is coupled to and controlled by a control circuit 100. Further, each of the bit lines $BL_i$ is also coupled to and controlled by the control circuit 100.

As shown in FIG. 2, the field line $FL_j$ is provided on the side of the second end portion (11b in FIG. 3) of the memory unit $10_{ij}$, and is spaced apart from the memory unit $10_{ij}$. The field line $FL_j$ is electrically insulated from yokes 25a to 25d and the memory unit $10_{ij}$.

The yoke 25a is disposed above the memory unit $10_{ij}$. The yoke 25a is disposed above all the field lines $FL_1$ to $FL_{n+1}$. Further, a plate electrode PL electrically coupled to the yoke 25a is in contact with and covers the upper surface of the yoke 25a. Further, the plate electrode PL is coupled to and controlled by the control circuit 100. The yoke 25a is electrically coupled to the plate electrode PL and may itself function as a plate electrode in some examples.

As shown in FIG. 1, the yoke 25b is provided in a line shape between the field line $FL_j$ and field line $FL_{j+1}$ adjacent to each other in plan view. The yoke 25b is electrically and magnetically coupled to the yoke 25a as shown in FIG. 2. The yoke 25d is provided in a pole shape between the two adjacent field line $FL_j$ and field line $FL_{j+1}$. The yoke 25d is electrically and magnetically coupled to the yokes 25a and 25b. The yoke 25c, as shown in FIG. 2, faces the bottom surfaces of the field lines $FL_1$ to $FL_{n+1}$ and is electrically separated from the yokes 25a, 25b, and 25d. The yoke 25c is magnetically coupled to the yokes 25a, 25b, and 25d, and a yoke 25, collectively including these portions (yokes 25a, 25b, 25c, 25d) as a whole, forms a magnetic circuit. A yoke 25 may be referred to as a magnetic circuit 25. Yoke 25 concentrates the magnetic flux generated by passing a current through the field line $FL_j$ at the end portion of the magnetic member $ML_{ij}$ and records a magnetic domain in the magnetic member $ML_{ij}$.

An alloy containing a 3d transition metal (for example, any one of iron (Fe), cobalt (Co), or nickel (Ni)) can be used for the material of the yokes 25a, 25b, 25c, and 25d. The materials of the yokes 25a to 25d may be the same magnetic material or different materials from one another. Permalloy (to which a non-magnetic material may be added), Heusler alloy, or a material having a granular structure in which magnetic particles are densely dispersed in an insulator matrix may be used for the material of the yokes 25a to 25d.

Each of the memory units $10_{ij}$ includes, as shown in FIG. 2, a magnetic memory line (magnetic member) $ML_{ij}$ made of a conductive magnetic material, a non-magnetic conductive layer $12_{ij}$, a magnetoresistive element $14_{ij}$, a non-magnetic conductive layer $16_{ij}$, a vertical thin film transistor $18_{ij}$, and a non-magnetic conductive layer $19_{ij}$.

Figure 3:
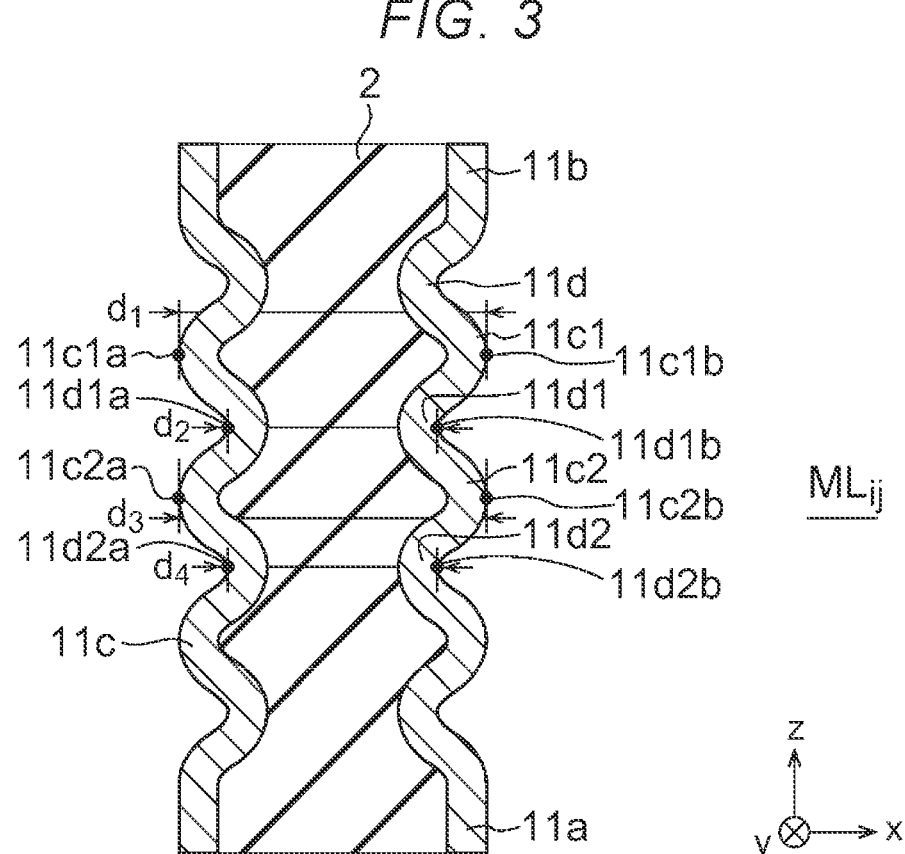
FIG. 3 is a cross-sectional view showing a configuration example of a magnetic member.

Each of the magnetic members $ML_{ij}$ includes a vertical magnetic material (for example, iron cobalt (CoFe) or magnesium oxide (MgO)) extending in the vertical direction (z direction) in FIG. 2 and has a cylindrical shape. The length of the magnetic member $ML_{ij}$ in the z direction is, for example, several microns (μm). FIG. 3 is a cross-sectional view showing a configuration example of a magnetic member $ML_{ij}$. A non-magnetic insulator 2 may be provided in the cylinder of each of the magnetic members $ML_{ij}$. That is, each of the magnetic members $ML_{ij}$ may surround a non-magnetic insulator 2. In the magnetic member $ML_{ij}$, as shown in FIG. 3, an area 11c1, a hanging portion 11d1, an area 11c2, and a hanging portion 11d2 are disposed in sequence along in the z direction. It is assumed that a distance between an end portion 11c1a and an end portion 11cb of the area 11c1 in the x direction in the cross section of the area 11c1 along the z direction is distance d1 (also referred to as diameter d1), a distance between an end portion 11d1a and an end portion 11d1b of the hanging portion 11d1 in the x direction in the cross section of the hanging portion 11d1 along the z direction is distance d2 (also referred to as diameter d2), a distance between an end portion 11c2a and an end portion 11c2b of the area 11c2 in the x direction in the cross section of the area 11c2 along the z direction is distance d3 (also referred to as diameter d3), and a distance between an end portion 11d2a and an end portion 11d2b of the hanging portion 11d2 in the x direction in the cross section of the hanging portion 11d2 along the z direction is defined as distance d4 (also referred to as diameter d4). In this case, the following conditions are satisfied:

$$d1 > d2$$

$$d1 > d4$$

$$d3 > d2$$

$$d3 > d4$$

The magnetic member $ML_{ij}$ from the hanging portion $11d1$ to the hanging portion $11d2$ records a magnetic domain. As a result, the magnetic domain can be recorded at intervals of several tens of nanometers in the magnetic member $ML_{ij}$. The magnetic member $ML_{ij}$ can function as a shift register type memory by moving the magnetic domain thereof on the magnetic member $ML_{ij}$ by a shift current.

Further, the magnetic member $ML_{ij}$ has a first end portion $11a$ (see FIG. 3) electrically coupled to the magnetoresistive element $14_{ij}$ through the non-magnetic conductive layer $12_{ij}$. The non-magnetic conductive layer $12_{ij}$ may be omitted. In this case, the first end portion $11a$ of the magnetic member $ML_{ij}$ is directly coupled to the magnetoresistive element $14_{ij}$. The bit line BL is provided on the side of the first end portion $11a$ of the magnetic member $ML_{ij}$. The bit line BL extends in the x direction intersecting the field lines $FL_1$ to $FL_{n+1}$.

Each of the magnetic members $ML_{ij}$ has a second end portion $11b$ electrically coupled to the yoke $25d$ (see FIG. 3). The yoke $25d$ and the yoke $25c$ are magnetically coupled. Here, "A is magnetically coupled to B" means that A and B form a magnetic circuit, and also includes a case where the respective magnetic bodies of the magnetic circuit are not directly in contact with each other. The yoke $25c$ faces the yoke $25a$. The field lines $FL_1$ to $FL_{n+1}$ are disposed between the yoke $25a$ and the yoke $25c$. The yoke $25b$ is provided corresponding to a plurality of memory units $10_{ij}$ arranged in the y direction as shown in FIG. 1 in plan view in the z direction. Each yoke $25d$ is provided corresponding to one memory unit $10_{ij}$ as shown in FIG. 1. In plan view, yoke $25d$ is disposed in the center of the cylinder between the magnetic members $ML_{ij}$. The yoke $25d$ is positioned on the same layer (level) as the yoke $25c$, and is magnetically coupled to the yoke $25c$. The yoke $25b$ is disposed between the yoke $25a$ and the yoke $25d$ and is electrically and magnetically coupled to the yoke $25a$ and the yoke $25d$. Accordingly, the plate electrode PL is electrically coupled in common to each of the memory units $10_{ij}$.

Figure 4:
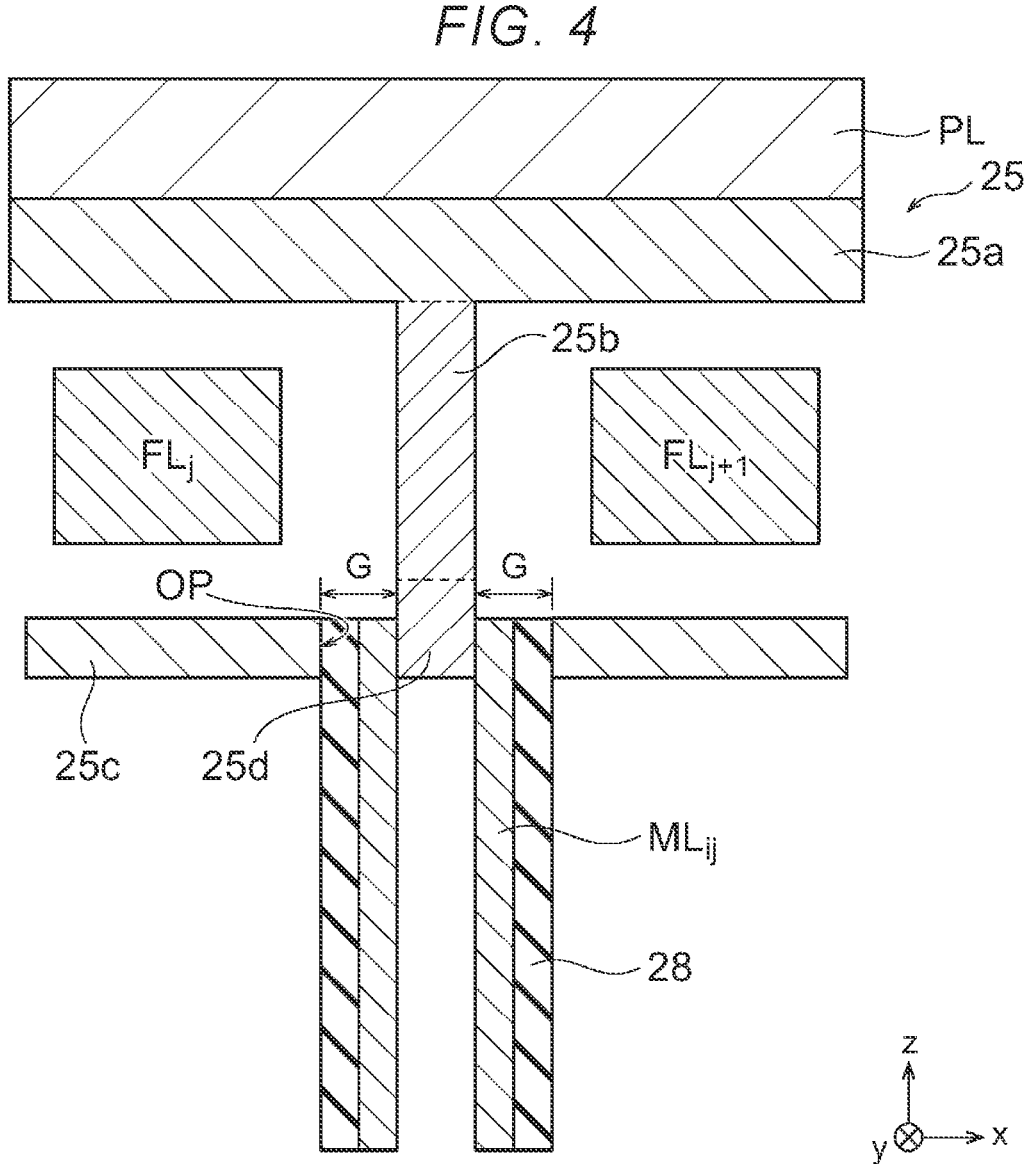
FIG. 4 is a cross-sectional view showing a configuration example of a yoke.

The yoke $25a$, the yoke $25b$, the yoke $25c$, and the yoke $25d$ configure a magnetic circuit $25$. A magnetic gap is formed in the magnetic circuit $25$. FIG. 4 is a cross-sectional view showing a configuration example of the magnetic circuit $25$ and a periphery thereof. For example, as shown in FIG. 4, the yoke $25b$ has one end coupled to the yoke $25a$ and the other end coupled to the yoke $25d$. A second end portion ($11b$ in FIG. 3) of each of the magnetic members $ML_{ij}$, has a magnetic gap provided between the corresponding yoke $25d$ and the yoke $25c$. A gap is between the yoke $25d$ and the yoke $25c$ on each side. The yoke $25d$ is electrically coupled to the inner side surface of the upper end portion of the corresponding magnetic member $ML_{ij}$. A non-magnetic insulating layer $28$ is disposed on the outer side surface of each of the magnetic members $ML_{ij}$, and the yoke $25d$ is magnetically coupled to the yoke $25c$ through the insulating layer $28$. The insulating layer $28$ is provided between the outer side surfaces of the plurality of magnetic members $ML_{ij}$ and the yoke $25c$. That is, in the case shown in FIG. 4, a magnetic gap G (the interval between the yoke $25c$ and the yoke $25d$) is the sum of the x direction thickness of a magnetic member $ML_{ij}$ and the x direction thickness of an insulating layer $28$.

Here, the yoke $25a$ is configured in a plate shape extending in an x-y plane. The yoke $25b$ is provided between the adjacent field lines $FL_k$ and $FL_{k+1}$ and has an elongated shape extending in the y direction substantially parallel to the field lines $FL_1$ to $FL_{n+1}$. The yoke $25b$ is configured in a line shape extending in the y direction (a plate shape extending in a y-z plane). The yoke $25b$ extends over a plurality of yokes $25d$ arranged along the y direction and is electrically and magnetically coupled to this plurality of yokes $25d$. The yoke $25c$ is configured in a plate shape extending in the x-y plane, but is closer to the magnetic member $ML_{ij}$ than the yoke $25a$ and is thus positioned in the $-z$ direction from the yoke $25a$. Furthermore, the yoke $25c$ has a plurality of holes into which the magnetic member $ML_{ij}$, the insulating layer $28$ and the end portion of the yoke $25d$ are inserted. The yoke $25d$ is inserted inside the end portion of the magnetic member $ML_{ij}$ and the insulating layer $28$ in the hole of the yoke $25c$, and is configured in a pole shape (cylindrical columnar shape) extending in the z direction. The upper end portions of the magnetic member $ML_{ij}$ and the insulating layer $28$ are interposed between the yoke $25c$ and the yoke $25d$. The materials of the yokes $25a$ to $25d$ may be the same magnetic material, or may be made of different materials from each other.

Figure 5:
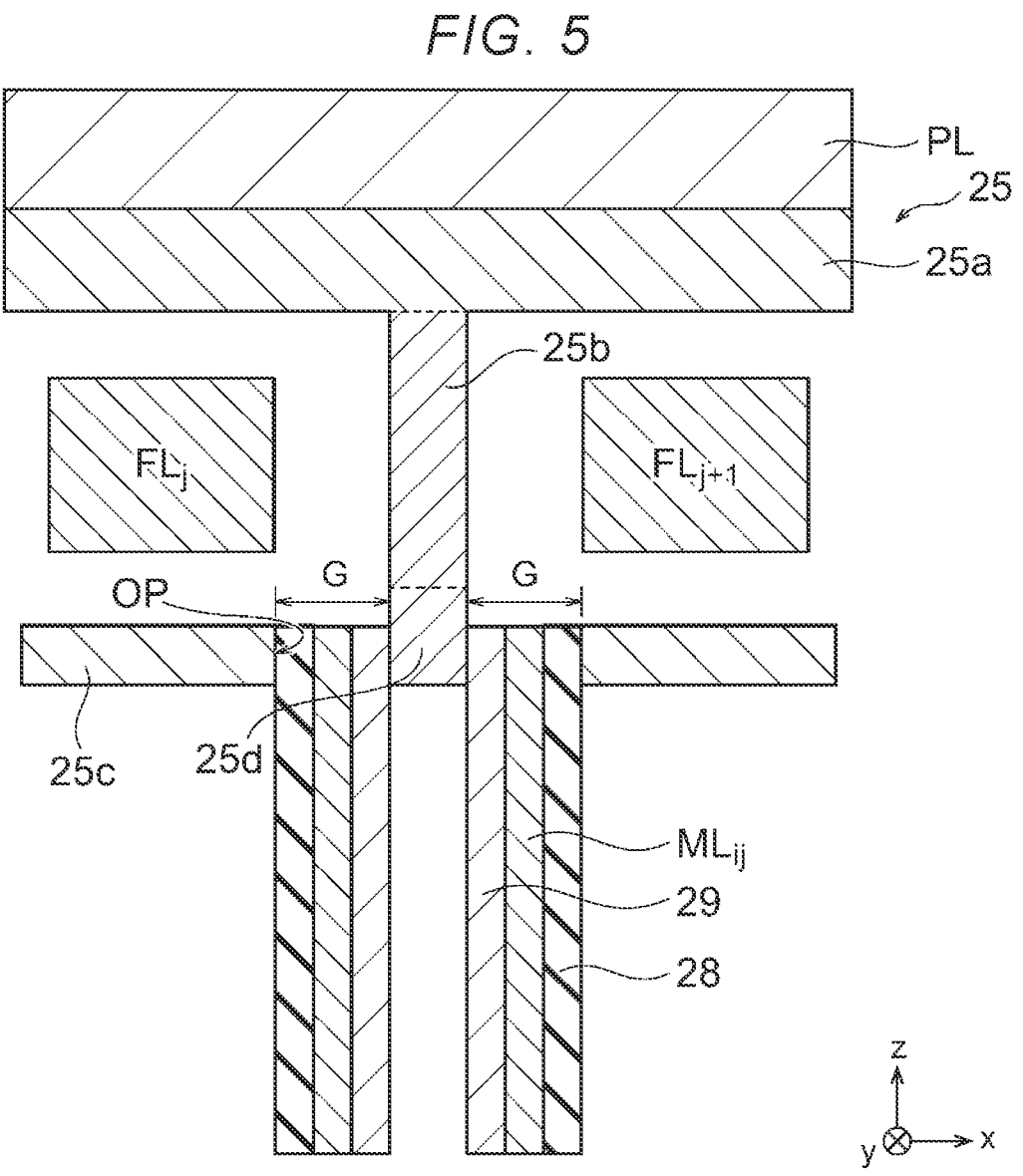
FIG. 5 is a cross-sectional view showing another configuration example of a yoke.

FIG. 5 is a cross-sectional view showing another configuration example of the yokes $25a$ to $25d$ and a periphery thereof. The magnetic gap of the magnetic circuit $25$ can also be obtained with the configuration shown in FIG. 5. In FIG. 5, a non-magnetic conductive layer $29$ is provided between each of the magnetic members $ML_{ij}$ and the yoke $25d$. The non-magnetic conductive layer $29$ is disposed along the z direction on the inner surface of each of the magnetic members $ML_{ij}$. In FIG. 5, the magnetic gap G is the sum of the x direction thickness of a non-magnetic conductive layer $29$, the x direction thickness of a magnetic member $ML_{ij}$, and the x direction thickness of insulating layer $28$. In FIGS. 4 and 5, a non-magnetic conductive layer may be used instead of the insulating layer $28$. Furthermore, each of the magnetic members $ML_{ij}$ may comprise a stacked structure including a magnetic layer (for example, CoFeB) and an insulating layer (for example, MgO). In this case, it may be preferable to remove the insulating layer at position where the magnetic member $ML_{ij}$ meets the yoke $25d$ so as to bring the yoke $25d$ and the magnetic layer into contact to electrically couple the yoke $25d$ to the magnetic layer. Since the MgO layer is often an extremely thin layer, a leak current may flow through the layer in any event. Therefore, the MgO layer may not necessarily have to be removed when present.

Furthermore, although each of the magnetic members $ML_{ij}$ is electrically coupled to the yokes $25b$ and $25d$ in the present embodiment, in other examples, each of the magnetic members $ML_{ij}$ may be electrically coupled to the yoke $25c$ instead. In this case, the yoke $25c$ is preferably electrically coupled to the yoke $25a$ elsewhere. A non-magnetic layer may be provided between each of the magnetic members $ML_{ij}$ and at least one of the yoke $25d$ and the yoke $25c$. Furthermore, each of the magnetic members $ML_{ij}$ may be electrically coupled to both the yoke $25d$ and the yoke $25c$. In this case, a non-magnetic conductive layer may be provided between each of the magnetic members $ML_{ij}$ and at least one of the yoke $25d$ and the yoke $25c$.

Returning to FIG. 2 again, the magnetic memory of the first embodiment will be described. The magnetoresistive element $14_{ij}$ reads out the information written in the magnetic member $ML_{ij}$, and for example, a magnetic tunnel junction (MTJ) element is used. The magnetoresistive element $14_{ij}$ will be described as an MTJ element in this example. The MTJ element $14_{ij}$ includes a free layer $14a$ (magnetization free layer) with a variable magnetization direction, a fixed layer $14c$ (reference layer) with a fixed magnetization direction, and a non-magnetic insulating layer $14b$ disposed between the free layer $14a$ and the fixed layer $14c$. In the MTJ element $14_{ij}$, the free layer $14a$ is electrically coupled to the first end portion $11a$ of the magnetic member $ML_{ij}$ through the corresponding non-magnetic conductive layer $12_{ij}$, and the fixed layer $14c$ is electrically coupled to the corresponding vertical thin film transistor $18_{ij}$ through the corresponding non-magnetic conductive layer $16_{ij}$. In this context, "the magnetization direction is variable" means that the magnetization direction can be changed by the leakage magnetic field from the corresponding magnetic member $ML_{ij}$ in a read operation, and "the magnetization direction is fixed" means that the magnetization direction does not change due to the leakage magnetic field from the corresponding magnetic member $ML_{ij}$ in normal operation.

One end of the vertical thin film transistor $18_{ij}$ is electrically coupled to the fixed layer $14c$ of the magnetoresistive element $14_{ij}$ through the non-magnetic conductive layer $16_{ij}$, and the other end is electrically coupled to the bit line $BL_i$ through the non-magnetic conductive layer $19_{ij}$. That is, the vertical thin film transistor $18_{ij}$ is provided between the magnetoresistive element $14_{ij}$ and the bit line $BL_i$. The vertical thin film transistor $18_{ij}$ includes a channel layer $18a$ extending in the z direction, and a gate electrode portion $SG_j$ surrounding or sandwiching the channel layer $18a$. That is, the gate electrode portion $SG_j$ covers at least a portion of the channel layer. The channel layer $18a$ includes, for example, crystalline silicon. The gate electrode portion $SG_j$ extends along the y direction and is coupled to and controlled by the control circuit $100$.

By turning on the vertical thin film transistor $18_{ij}$, a current is passed between the plate electrode PL and the bit line BL (shown in FIG. 2) through the magnetic member $ML_{ij}$. As a result, the magnetic domain formed as write data at the end portion $11b$ of the magnetic member $ML_{ij}$ is shifted in the z direction within the magnetic member $ML_{ij}$ to write data into the magnetic member $ML_{ij}$. Further, at the time of reading, by turning on the vertical thin film transistor $18_{ij}$, a current is passed between the plate electrode PL and the bit line BL through the magnetic member $ML_{ij}$. As a result, the magnetic domain corresponding to the written data is shifted in the z direction to the end portion $11a$, and the magnetization of the free layer $14a$ of the magnetoresistive element $14_{ij}$ is set in the direction corresponding to the write data, and reading is performed.

The yokes $25a$, $25b$, $25c$, and $25d$ surround a portion of each of the field lines $FL_1$ to $FL_{n+1}$, as shown in FIG. 2. For example, the yoke $25a$ faces the upper surface of each of the field lines $FL_1$ to $FL_{n+1}$ to cover the upper surface. The yoke $25c$ (also called a return yoke $25c$) faces and cover the lower surface of each of the field lines $FL_1$ to $FL_{n+1}$. The yoke $25b$ couples the yoke $25a$ to the yoke $25d$ and is disposed on the side portion of each of the field lines $FL_1$ to $FL_{n+1}$. The yoke $25b$ is provided between the adjacent field lines $FL_1$ to $FL_{n+1}$ and extends in the y direction in a line shape (a plate shape extending in the y-z plane) substantially parallel to each of the field lines $FL_1$ to $FL_{n+1}$. Therefore, the yoke $25b$ faces the side surface of the field lines $FL_1$ to $FL_{n+1}$ to cover the side surface thereof. As shown in FIGS. 4 and 5, the yoke $25d$ is inserted into each of the magnetic members $ML_{ik}$ from the second end portion $11b$ and electrically coupled to the corresponding magnetic member $ML_{ik}$. The yoke $25a$ is spaced apart from the upper surface of each of the field lines $FL_1$ to $FL_{n+1}$, the yoke $25b$ is spaced apart from the side surface of each of the field lines $FL_1$ to $FL_{n+1}$, and the yoke $25c$ is spaced apart from the lower surface of each of the field lines $FL_1$ to $FL_{n+1}$.

Figure 6:
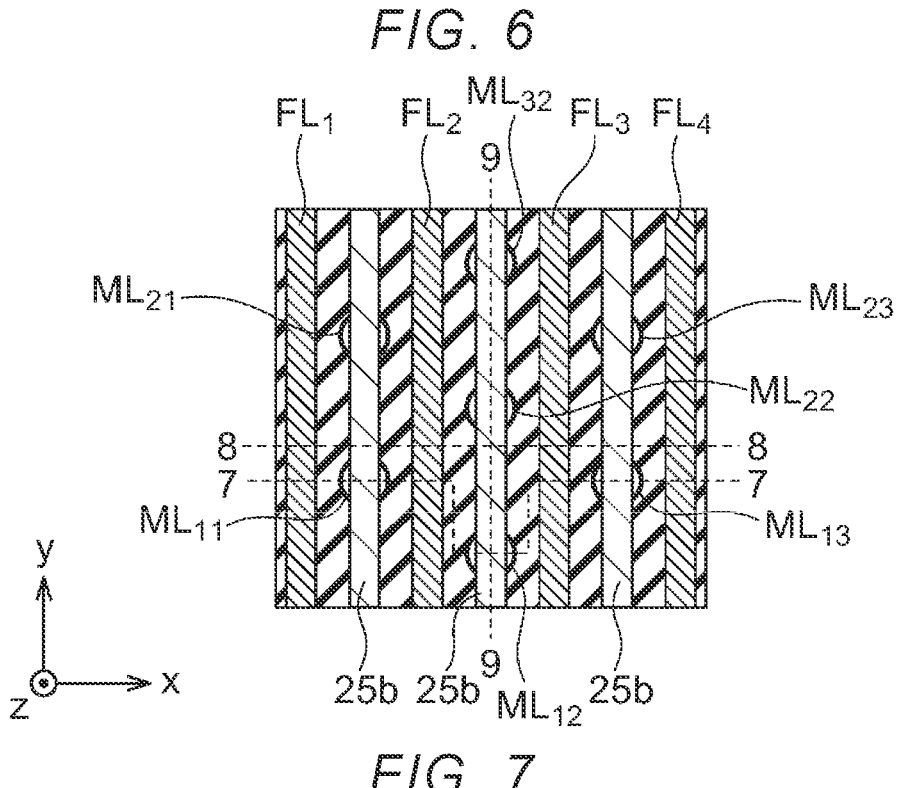
FIG. 6 is a schematic plan view showing aspects of a magnetic memory according to a first embodiment.

FIG. 6 is a schematic plan view showing a configuration example of the magnetic memory according to the first embodiment. FIG. 6 shows a layout of the field lines $FL_1$ to $FL_4$, a plurality of yokes $25b$, and the magnetic members $ML_{11}$ to $ML_{32}$.

The field lines $FL_1$ to $FL_4$ and the yoke $25b$ extend substantially parallel to the y direction and are disposed at substantially the same height in the z direction. The yokes $25b$ are disposed in a line shape between the field lines $FL_1$ to $FL_4$ adjacent to each other. A yoke $25b$ and the field lines $FL_1$ to $FL_4$ are alternately disposed in a line-and-space shape in the x direction.

The magnetic members $ML_{11}$ to $ML_{32}$ are provided below the yoke $25b$. Each of the magnetic members $ML_{11}$ to $ML_{32}$ has, for example, a cylindrical shape. Six different near adjacent magnetic members are disposed in six directions of a magnetic member. These six magnetic members are disposed substantially at the vertices of a regular hexagon. For example, the inner diameters of the magnetic members $ML_{11}$ to $ML_{32}$ are approximately 40 nm. The interval between the adjacent magnetic members $ML_{11}$ to $ML_{32}$ is approximately 100 nm.

Figure 7:
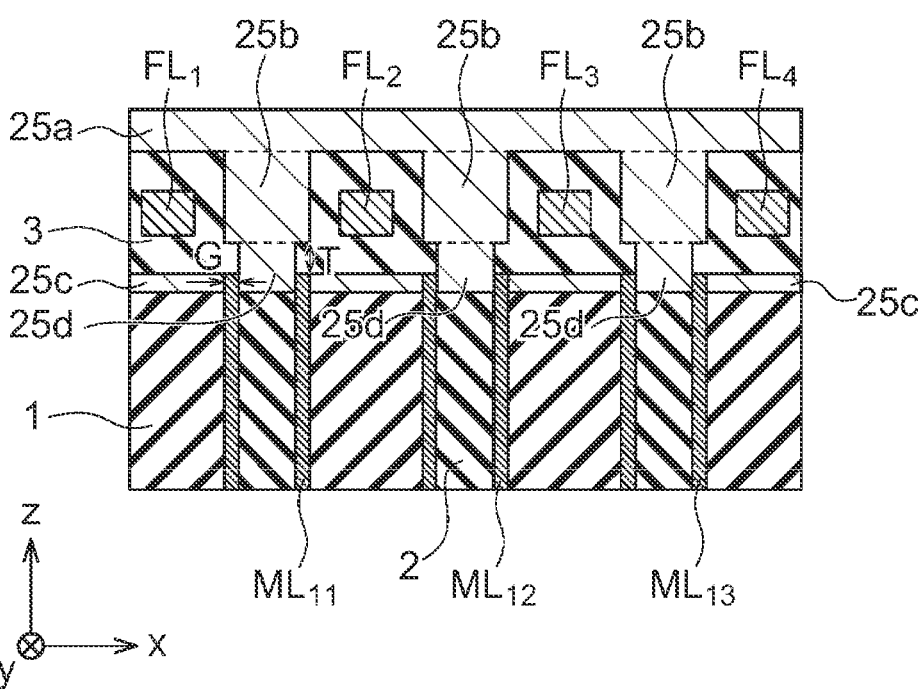
FIG. 7 is a schematic cross-sectional view of a magnetic memory according to a first embodiment.
Figure 8:
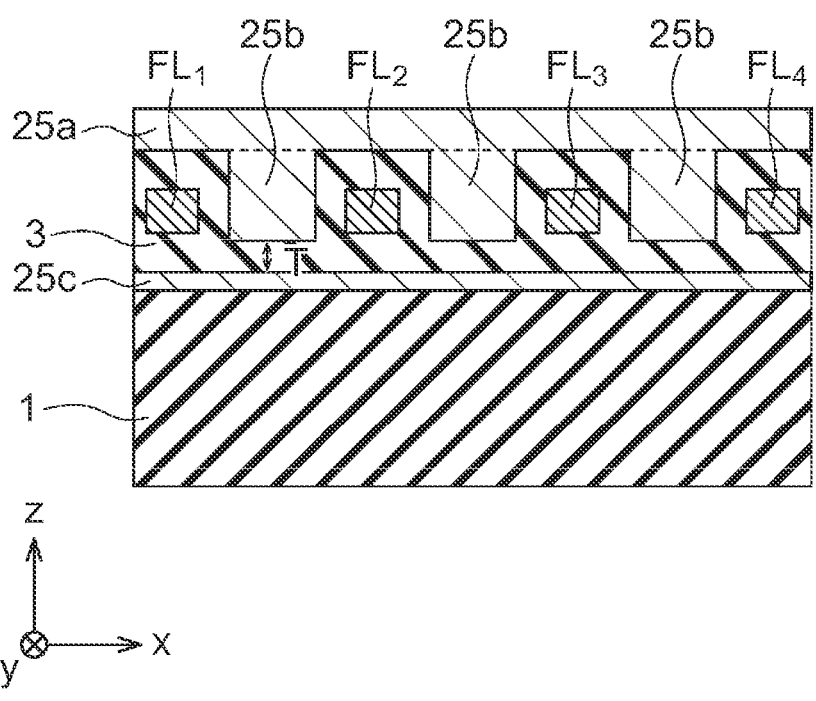
FIG. 8 is a schematic cross-sectional view of a magnetic memory according to a first embodiment.
Figure 9:
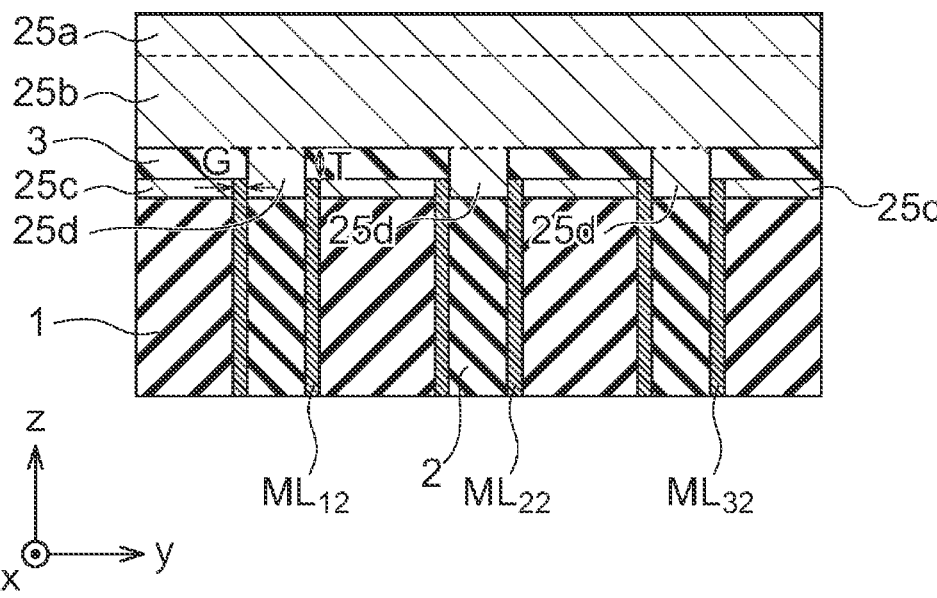
FIG. 9 is a schematic cross-sectional view of a magnetic memory according to a first embodiment.

FIGS. 7 to 9 are schematic cross-sectional views showing configuration examples of the magnetic memory according to the first embodiment. FIG. 7 shows a cross section taken along line 7-7 of FIG. 6. FIG. 8 shows a cross section taken along line 8-8 of FIG. 6. FIG. 9 shows a cross section taken along line 9-9 of FIG. 6. The depiction of the structure above the yoke $25a$ is omitted. Additionally, the depiction of the structure below the magnetic members $ML_{11}$ to $ML_{32}$ is also omitted.

As shown in FIGS. 7 and 9, the magnetic members $ML_{11}$ to $ML_{32}$ extend in the z direction and penetrate the non-magnetic insulating layer 1. Aluminum oxide, for example, is used for the non-magnetic insulating layer 1. The magnetic members $ML_{11}$ to $ML_{32}$ have a hollow cylindrical shape. The non-magnetic insulator 2 is provided inside the magnetic members $ML_{11}$ to $ML_{32}$. A non-magnetic insulating material such as a silicon oxide film, for example, can be used for the non-magnetic insulator 2.

The yoke $25d$ is inside the upper end portions of the magnetic members $ML_{11}$ to $ML_{32}$. The yoke $25d$ is provided corresponding to the magnetic members $ML_{11}$ to $ML_{32}$ and is configured in a columnar shape having a smaller diameter than the inner diameters of the magnetic members $ML_{11}$ to $ML_{32}$.

The yoke $25b$ is provided on the yoke $25d$. As shown in FIG. 9, the yoke $25b$ extends in the y direction over a plurality of yokes $25d$ arranged in the y direction, and is electrically and magnetically coupled to this plurality of yokes $25d$. The yoke $25b$ has an elongated shape of a line shape extending in the y direction in plan view from the z direction as shown in FIG. 6. The yoke $25b$ has a plate shape or a rod shape in cross sections as shown in FIGS. 7 and 8. Furthermore, as shown in FIGS. 7 and 8, the plurality of yokes $25b$ and the field lines $FL_1$ to $FL_4$ are alternately disposed in the x direction. The field lines $FL_1$ to $FL_4$ are disposed between the yokes $25b$ otherwise adjacent to each other. A non-magnetic insulating layer 3 covers the periphery of the field lines $FL_1$ to $FL_4$. That is, the non-magnetic insulating layer 3 is provided between the yoke $25b$ and the field lines $FL_1$ to $FL_4$ to electrically insulate the yoke 25b from the field lines $FL_1$ to $FL_4$. A non-magnetic insulating material such as a silicon oxide film, for example, can be used for the non-magnetic insulating layer 3. The width of the yoke 25b in the x direction may be larger than, may be equal to, or may be smaller than the width of the yoke 25d in the x direction.

The yoke 25a is provided on the yoke 25b. As shown in FIGS. 7 to 9, the yoke 25a is configured in a plate shape extending in the x-y plane above the field lines $FL_1$ to $FL_4$ and is provided on a plurality of yokes 25b. The yoke 25a is electrically and magnetically coupled to the plurality of yokes 25b.

The yoke 25c is configured in a plate shape extending in the x-y plane below the field lines $FL_1$ to $FL_4$ and has a plurality of holes corresponding in position to the magnetic members $ML_{11}$ to $ML_{32}$. The upper end portions of the magnetic members $ML_{11}$ to $ML_{32}$ and the lower end portion of the yoke 25d extend into the plurality of holes of the yoke 25c. That is, the upper end portions of the magnetic members $ML_{11}$ to $ML_{32}$ and the lower end portion of the yoke 25d are surrounded by the yoke 25c. Although FIGS. 7 and 9 do not show an insulating layer 28 or a non-magnetic conductive layer 29, the upper end portions of the insulating layer 28 or the non-magnetic conductive layer 29 are also inside the plurality of holes of the yoke 25c shown in FIGS. 4 and 5. The yoke 25c is electrically separated from the other yokes 25a, 25b, and 25d, but is magnetically coupled to the yoke 25d.

The magnetic gap G between the yoke 25c and the yoke 25d is smaller than the thickness of the non-magnetic insulating layer 3 between the yoke 25c and the yoke 25b. In other words, the x direction distance between the yoke 25c and the yoke 25d is shorter than the z direction distance between the yoke 25c and the yoke 25b. As a result, the magnetic flux is concentrated more easily between the yoke 25c and the yoke 25d than between the yoke 25c and the yoke 25b, and it is possible to increase the write efficiency.

In the present embodiment, a yoke 25b between the yoke 25a and the yoke 25d extends along a direction parallel to the field lines $FL_1$ to $FL_4$ and is configured in a plate shape or a rod shape. Further, yokes 25b are provided adjacent to both sides of each of the field lines $FL_1$ to $FL_4$, face the side surfaces of the field lines $FL_1$ to $FL_4$, and cover both side surfaces of the field lines $FL_1$ to $FL_4$. Therefore, when a current is passed through the field lines $FL_1$ to $FL_4$, the magnetic circuit 25 can efficiently collect the magnetic fluxes of the field lines $FL_1$ to $FL_4$.

Further, by configuring the yoke 25b in a plate shape or a rod shape extending parallel along the field lines $FL_1$ to $FL_4$, the yoke 25b can be easily formed in the manufacturing of the magnetic memory.

Write Method

Figure 10:
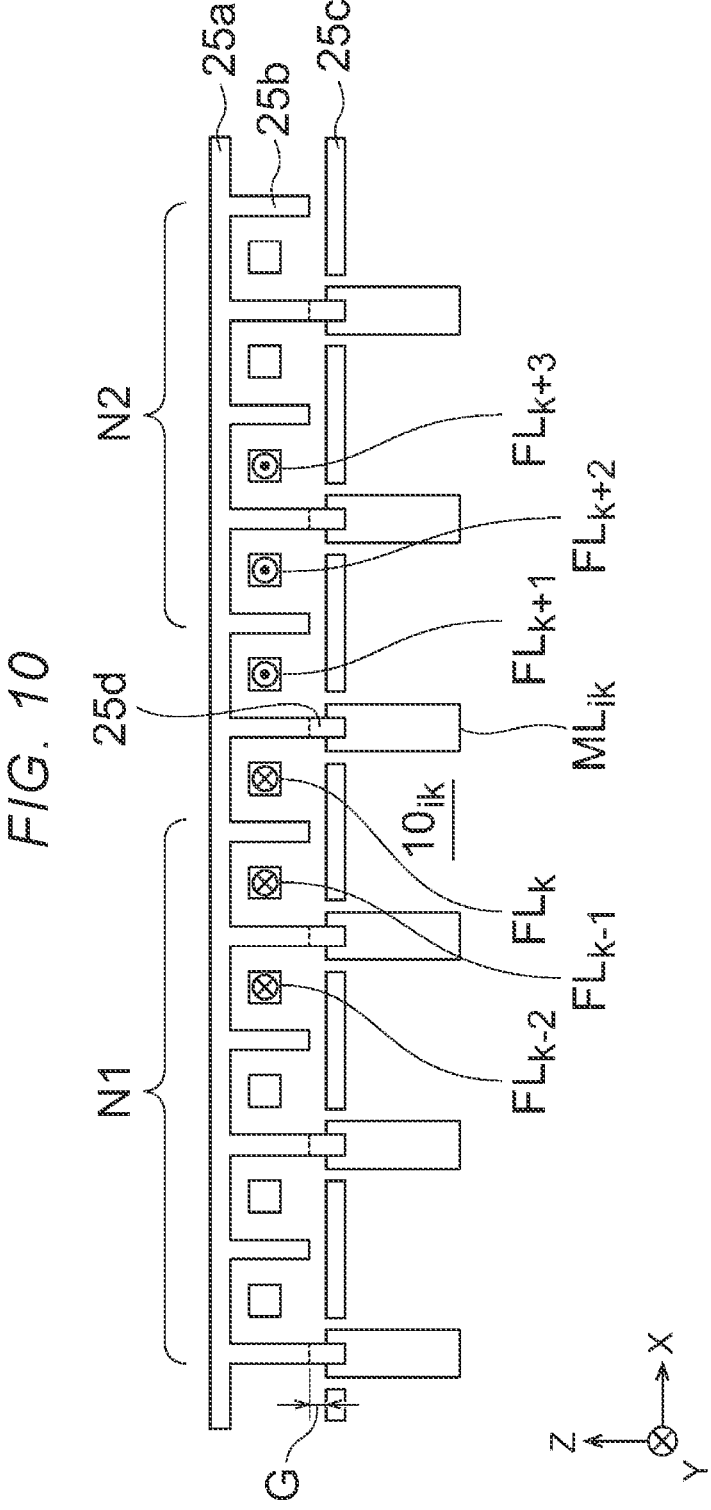
FIG. 10 depicts aspects related to a writing of information to a magnetic member of a memory unit.

Next, a write method for the magnetic memory of the first embodiment will be described with reference to FIG. 10. FIG. 10 is a view showing a case where information is being written to the magnetic member $ML_{ik}$ of the memory unit $10_{ik}$ on the i-th row and the k-th column, where i and k are positive integers. In this case, a write current is divided and passed through the N1 field lines $FL_k$, $FL_{k-1}$, . . . and $FL_{k-N1+1}$ positioned on the upper left side of the memory unit $10_{ik}$, and a reverse write current is divided and passed through the N2 field lines $FL_{k+1}$, $FL_{k+2}$, . . . and $FL_{k+N2}$ positioned on the upper right side of the memory unit $10_{ik}$. Information (a magnetization direction) corresponding to each write current is written to the upper portion of the magnetic member $ML_{ik}$ of the memory unit $10_{ik}$ positioned below between the two adjacent field lines with different directions of the write currents. For example, information (data) is written to magnetic member $ML_{ik}$ between the field line $FL_k$ and the field line $FL_{k+1}$. For example, the write current is passed through the N1 field lines $FL_k$, $FL_{k-1}$, . . . and $FL_{k-N1+1}$ in the front to back direction, and the write current is passed through the N2 field lines $FL_{k+1}$, $FL_{k+2}$, . . . and $FL_{k+N2}$ in the back to front direction. The information (magnetization direction) written at this time is an outward magnetization direction with respect to the cross section of the magnetic member $ML_{ik}$.

On the other hand, when the write current is passed through the field lines $FL_k$, $FL_{k-1}$, . . . and $FL_{k-N1+1}$ in the back to front direction, and the write current is passed through the N2 field lines $FL_{k+1}$, $FL_{k+2}$, . . . and $FL_{k+N2}$ in the front to back direction, the information (magnetization direction) written to the magnetic member $ML_{ik}$ of the memory unit $10_{ik}$ is an inward magnetization direction with respect to the cross section of the magnetic member $ML_{ik}$.

In this manner, in the cross section of the magnetic member $ML_{ik}$, the magnetization direction of the magnetic domain is radial, and 1-bit data (binary data) can be stored depending on whether the magnetization direction is outward or inward.

Figure 11:
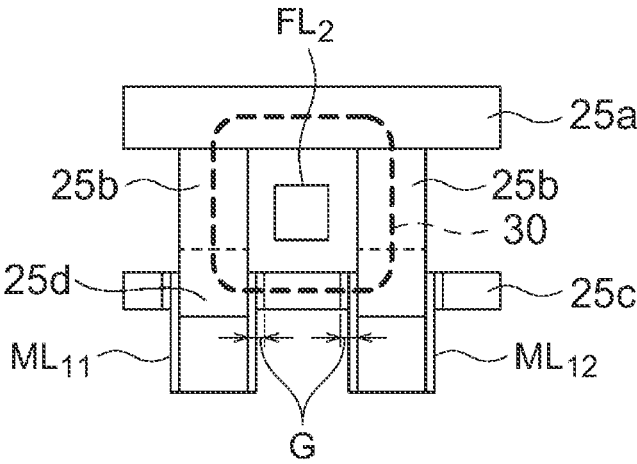
FIG. 11 is a schematic view related to a case where a write is performed by passing a write current through a field line.

Next, it will be described with reference to FIGS. 11 and 12 that a write operation is possible although the write current is divided into a plurality of field lines. FIG. 11 is a schematic view showing a case where a write is performed by passing a write current, for example, 2 mA, through the field line $FL_2$ shown in FIG. 2. In this case, the yoke 25d, the yoke 25b, and the yoke 25a on the magnetic member $ML_{11}$, the yoke 25d and the yoke 25b on the magnetic member $ML_{12}$, and the yoke 25c between the magnetic member $ML_{12}$ and the magnetic member $ML_{11}$ form a magnetic circuit 30 indicated by dashed lines in FIG. 11. In the magnetic circuit 30, a magnetic gap G is provided between the yoke 25c and the yoke 25d on the $ML_{11}$ side, and a magnetic gap G is provided between the yoke 25c and the yoke 25d on the $ML_{12}$ side. When the dimension of each of the magnetic gaps G is L and the current value penetrating the magnetic circuit 30 is I, a magnetic field strength H in the magnetic gaps G is H=I/(2 L) according to Ampere's law. In FIG. 11, since I=2 mA, H=2 mA/(2 L). The magnetic resistance of the yokes 25a, 25b, and 25c and the yoke 25d in the magnetic circuit 30 is zero.

Figure 12:
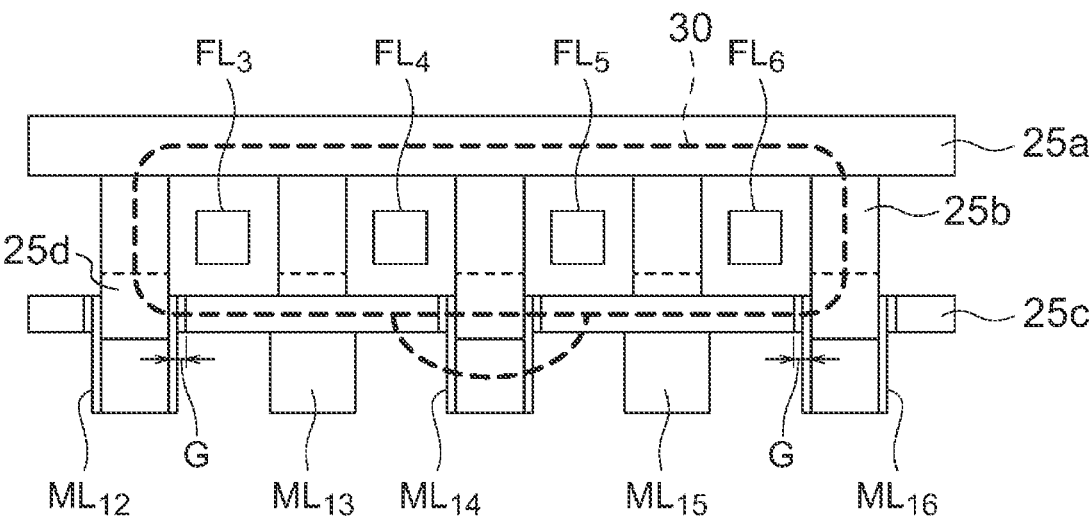
FIG. 12 is a cross-sectional view taken along line B-B of FIG. 1.

On the other hand, FIG. 12 shows a schematic view of a case where the write current is divided by and passed through the four field lines. FIG. 12 is a cross-sectional view taken along line B-B of FIG. 1. In FIG. 12, the yoke 25d, the yoke 25b, and the yoke 25a on the magnetic member $ML_{12}$, and the yoke 25d, the yoke 25b, and the yoke 25c on the magnetic member $ML_{16}$ form the magnetic circuit 30 indicated by dashed lines in FIG. 12. In the magnetic circuit 30, the magnetic gap G is provided between the yoke 25d and the yoke 25c of the magnetic member $ML_{12}$, and the magnetic gap G is provided between the yoke 25d and the yoke 25c of the magnetic member $ML_{16}$. Although it appears that a magnetic gap is also provided between the yoke 25d and the yoke 25c in the magnetic member $ML_{14}$, the yoke 25c is continuously coupled and bypasses the outer periphery of the magnetic member $ML_{14}$ to form the magnetic circuit 30. Consequently, no magnetic gap is generated between the yoke 25d and the yoke 25c of the magnetic member $ML_{14}$. For the magnetic field strength H in the magnetic gap in this case, when the dimension of each of the magnetic gaps G is L and the current value penetrating the magnetic circuit 30 is I, the magnetic field strength H in the magnetic gap G thereof is $H=I/(2 L)$ according to Ampere's law. In FIG. 12, $I=0.5$ mA$\times 4=2$ mA, so that $H=2$ mA$/(2 L)$. That is, the magnetic field strength in the magnetic gap G is the same as in the case shown in FIG. 11. This means that although the write current is divided into the plurality of field lines, the same write operation can be performed as when the current is not divided.

Read Method

Next, read method will be explained. When information is read from the memory unit, for example, when information is read from the memory unit $10_{12}$, if the information to be read is positioned at the lowermost portion of the magnetic member $ML_{12}$ of the memory unit $10_{12}$, that is, the area closest to the MTJ element $14_{12}$, the magnetization direction of the free layer 14a of the MTJ element $14_{12}$ is also changed corresponding to the information stored in the lowermost portion of the magnetic member $ML_{12}$. Therefore, the control circuit 100 is used to pass a read current between the plate electrode PL and the bit line $BL_1$ and to read the information from the MTJ element $14_{12}$. The read information corresponds to the resistance state of the MTJ element $14_{12}$. For example, when the resistance of the MTJ element $14_{12}$ is high, the magnetization directions of the free layer 14a and the fixed layer 14c of the MTJ element $14_{12}$ correspond to a state closer to antiparallel (for example, 90 degrees or more) than when the resistance is low, and when the resistance of the MTJ element $14_{12}$ is low, the magnetization directions of the free layer 14a and the fixed layer 14c of the MTJ element $14_{12}$ correspond to a state closer to parallel (for example, 90 degrees or less) than when the resistance is high.

When the information to be read is not at the lowermost portion of the magnetic member $ML_{12}$ of the memory unit $10_{12}$, a shift current is passed between the plate electrode PL and the bit line $BL_1$ by using the control circuit 100, and the information to be read is moved to be eventually positioned at the lowermost portion of the magnetic member $ML_{12}$. After that, the information can be read by performing the read operation mentioned above.

Next, a manufacturing method of the magnetic memory according to the first embodiment will be described.

FIGS. 13A to 19A are plan views showing aspects of a manufacturing method of the magnetic memory according to the present embodiment. FIGS. 13B to 19B are cross-sectional views showing aspects of the manufacturing method of the magnetic memory according to the present embodiment. FIGS. 13B to 19B correspond to cross sections taken along line B-B of FIGS. 13A to 19A, respectively. FIG. 20 is a cross-sectional view showing an example of the completed structure of the magnetic memory according to the first embodiment.

Figure 13A:
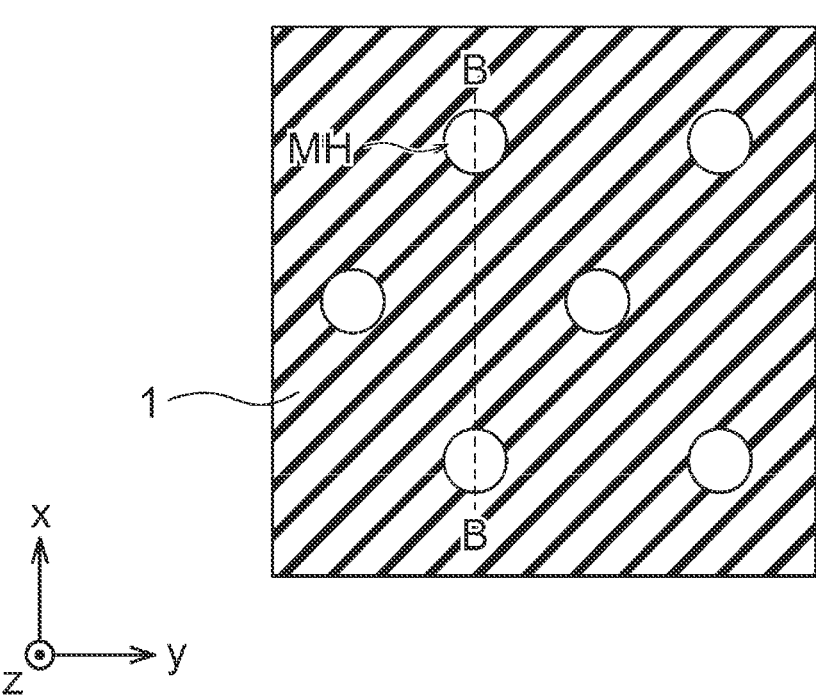
FIG. 13A is a plan view showing aspects related to a manufacturing method for a magnetic memory according to a first embodiment.
Figure 13B:
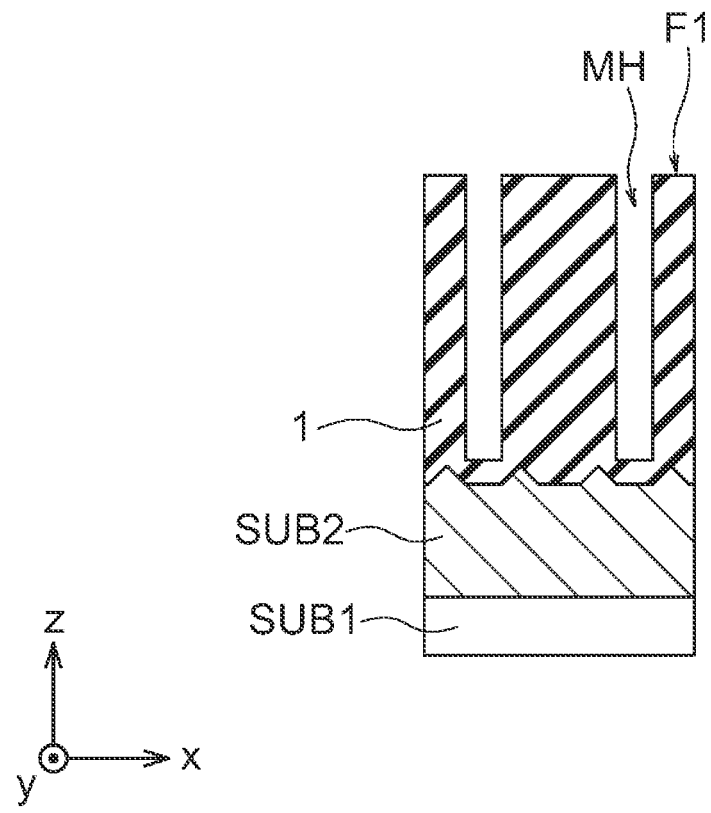
FIG. 13B is a cross-sectional view showing aspects related to a manufacturing method for a magnetic memory according to a first embodiment.

As shown in FIGS. 13A and 13B, a non-magnetic layer SUB2 is fixed on a supporting substrate SUB1. The supporting substrate SUB1 may be, for example, a silicon substrate or the like. A non-magnetic metal material such as aluminum, for example, can be used for the non-magnetic layer SUB2.

Next, a plurality of memory holes MH are formed in the non-magnetic layer SUB2 from a surface F1 side by using lithography technology and an anodization method. In this processing, a portion of the non-magnetic layer SUB2 is oxidized. Therefore, the non-magnetic insulating layer 1 is formed by the oxidation of non-magnetic layer SUB2. The non-magnetic insulating layer 1 is, for example, a non-magnetic oxide such as aluminum oxide. As shown in FIG. 13A (and similarly in FIG. 6), memory holes MH adjacent in six directions are disposed around each of the memory holes MH in plan view from the z direction. The inner diameter of a memory hole MH is, for example, approximately 40 nm. The interval between the two nearest adjacent memory holes MH is, for example, approximately 100 nm.

Figure 14A:
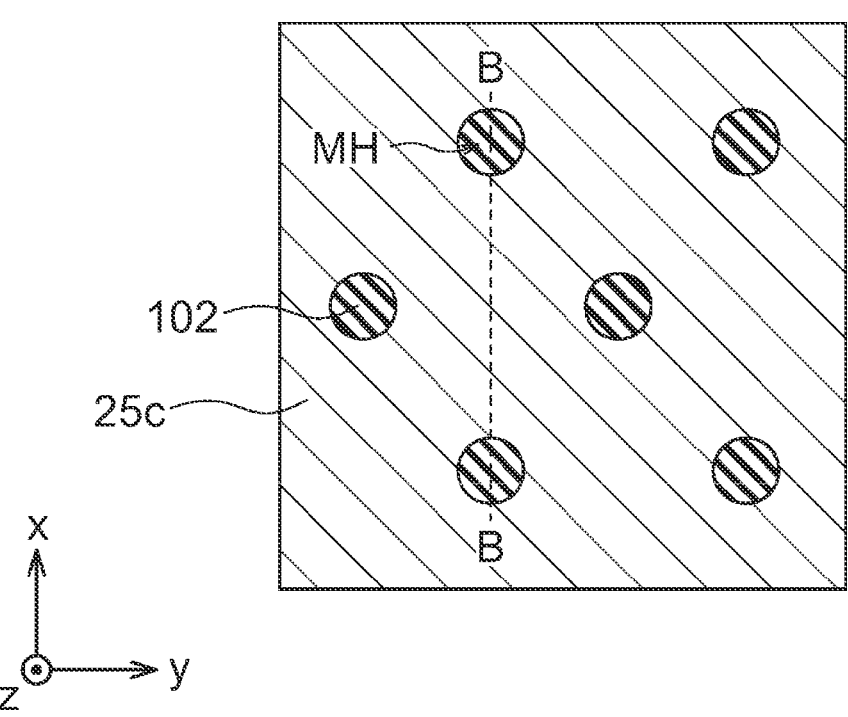
FIG. 14A is a plan view showing aspects related to a manufacturing method for a magnetic memory according to a first embodiment.
Figure 14B:
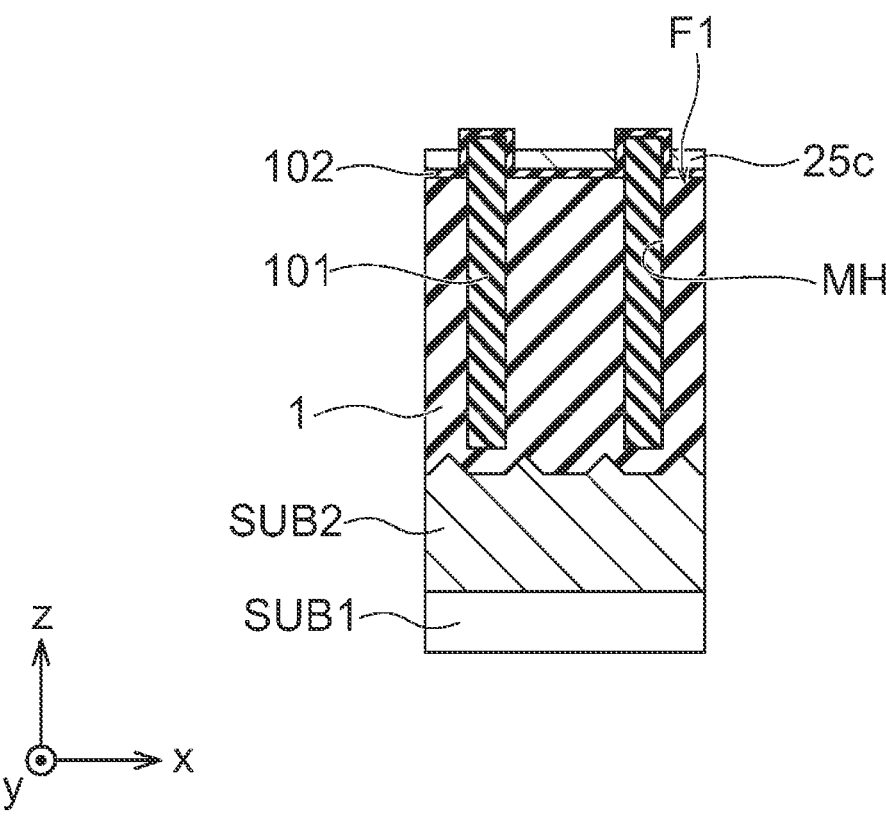
FIG. 14B is a cross-sectional view showing aspects related to a manufacturing method for a magnetic memory according to a first embodiment.

Next, as shown in FIGS. 14A and 14B, a sacrificial film 101 is embedded in the memory holes MH. A non-magnetic insulating material such as a silicon oxide film can be used for the sacrificial film 101.

Next, the surface F1 of the non-magnetic insulating layer 1 is selectively etched back, and the upper end of the sacrificial film 101 protrudes to some extent. A non-magnetic insulating layer 102 is formed on the surface F1 of the non-magnetic insulating layer 1 and the sacrificial film 101. A silicon oxide film or the like, for example, can be used for the non-magnetic insulating layer 102. The yoke 25c is formed on the non-magnetic insulating layer 102 at the periphery of the memory hole MH and the sacrificial film 101. After the material of the yoke 25c is deposited on the non-magnetic insulating layer 102, the material of the yoke 25c is polished by chemical mechanical polishing (CMP) method or the like until the non-magnetic insulating layer 102 on the sacrificial film 101 is exposed. As a result, the yoke 25c is formed in a self-aligned manner in the areas outside the memory hole MH and the sacrificial film 101 on the surface F1. A magnetic material can be used for the yoke 25c.

Figure 15A:
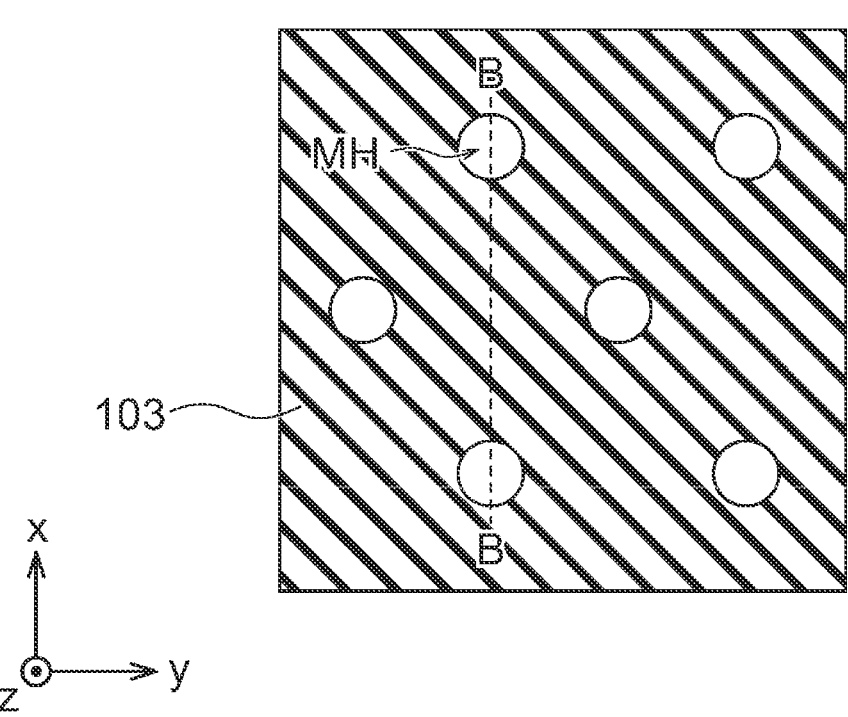
FIG. 15A is a plan view showing aspects related to a manufacturing method for a magnetic memory according to a first embodiment.
Figure 15B:
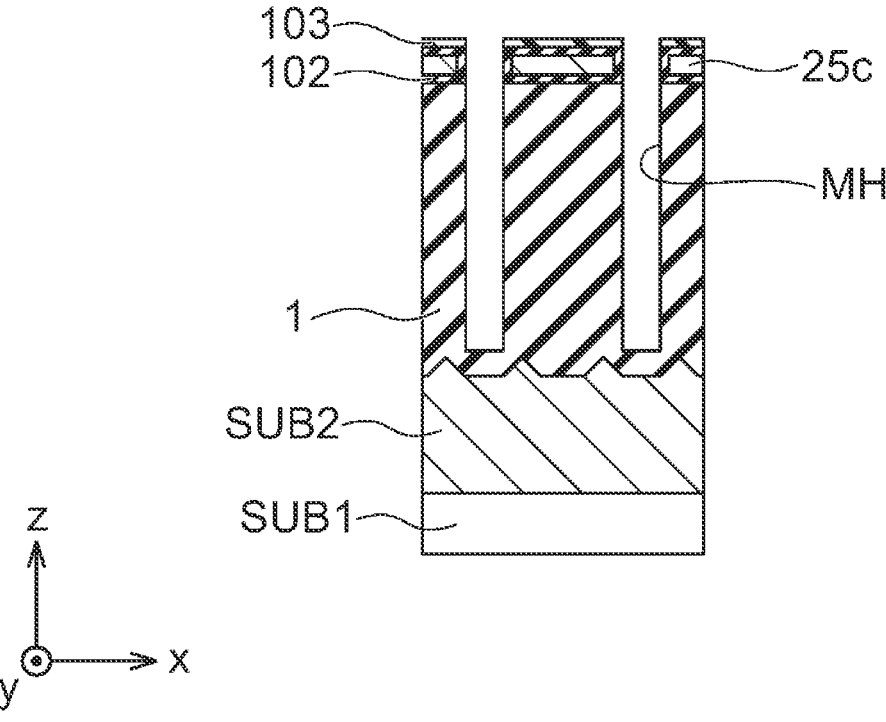
FIG. 15B is a cross-sectional view showing aspects related to a manufacturing method for a magnetic memory according to a first embodiment.

Next, as shown in FIGS. 15A and 15B, non-magnetic insulating layer 102 is further formed on the upper surface of yoke 25c. A mask material 103 is formed on the non-magnetic insulating layer 102 formed on the yoke 25c. For the mask material 103, a material having etching selectivity with respect to the sacrificial film 101, such as a silicon nitride film can be used. Next, the mask material 103 and the non-magnetic insulating layer 102 are polished using a CMP method or the like until the upper end of the sacrificial film 101 is exposed. As a result, the mask material 103 is left in a self-aligned manner on the surface F1 in areas other than above the memory holes MH and the sacrificial film 101, that is, the mask material 103 is left above the yoke 25c. Next, the sacrificial film 101 in the memory holes MH is selectively removed. As a result, the structure shown in FIGS. 15A and 15B is obtained.

Figure 16A:
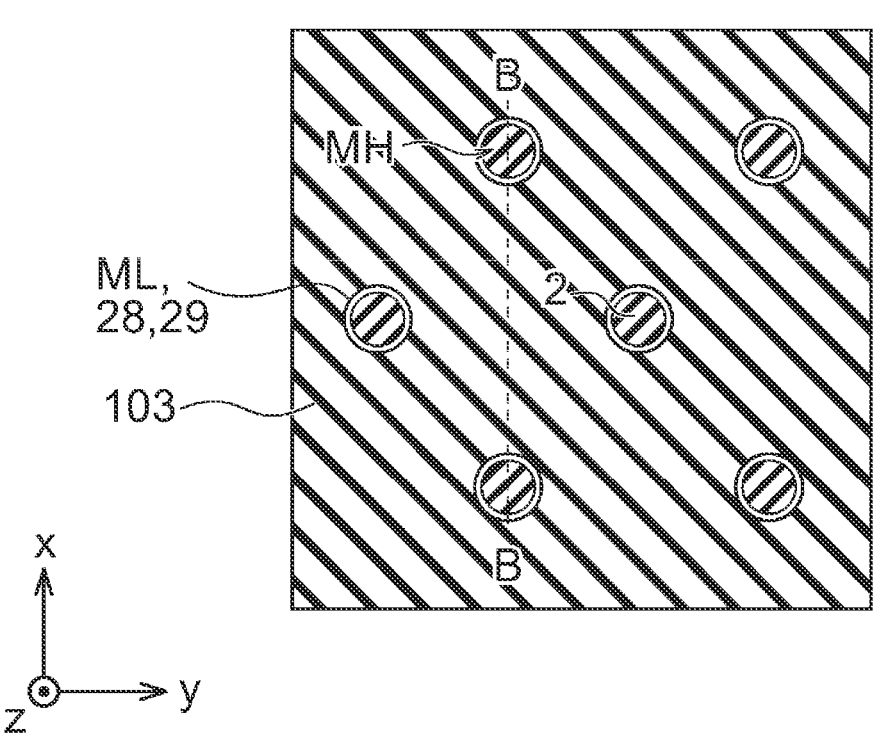
FIG. 16A is a plan view showing aspects related to a manufacturing method for a magnetic memory according to a first embodiment.
Figure 16B:
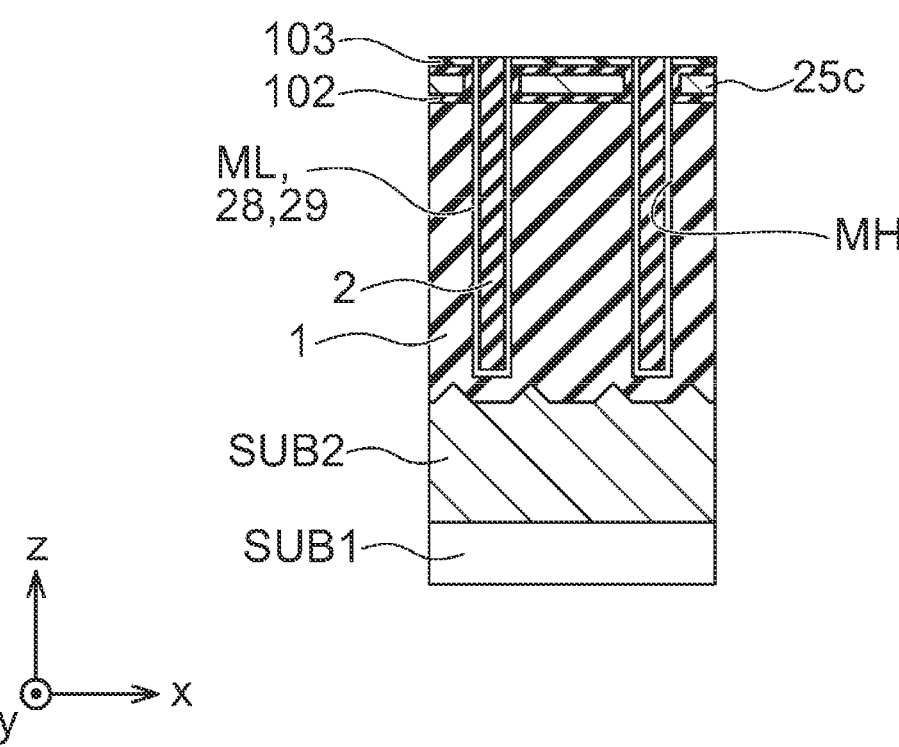
FIG. 16B is a cross-sectional view showing aspects related to a manufacturing method for a magnetic memory according to a first embodiment.

Next, as shown in FIGS. 16A and 16B, the magnetic members $ML_{ij}$ are formed on the inner walls of each of the memory holes MH. Further, the insulating layer 28 and/or the non-magnetic conductive layer 29, as shown in FIG. 4 or 5, may be formed on the inner walls of each of the memory holes MH in this processing. Next, the non-magnetic insulator 2 is embedded inside the magnetic member $ML_{ij}$ in the memory hole MH. A silicon oxide film or the like, for example, is used for the non-magnetic insulator 2. As a result, the structure shown in FIGS. 16A and 16B is obtained.

Figure 17A:
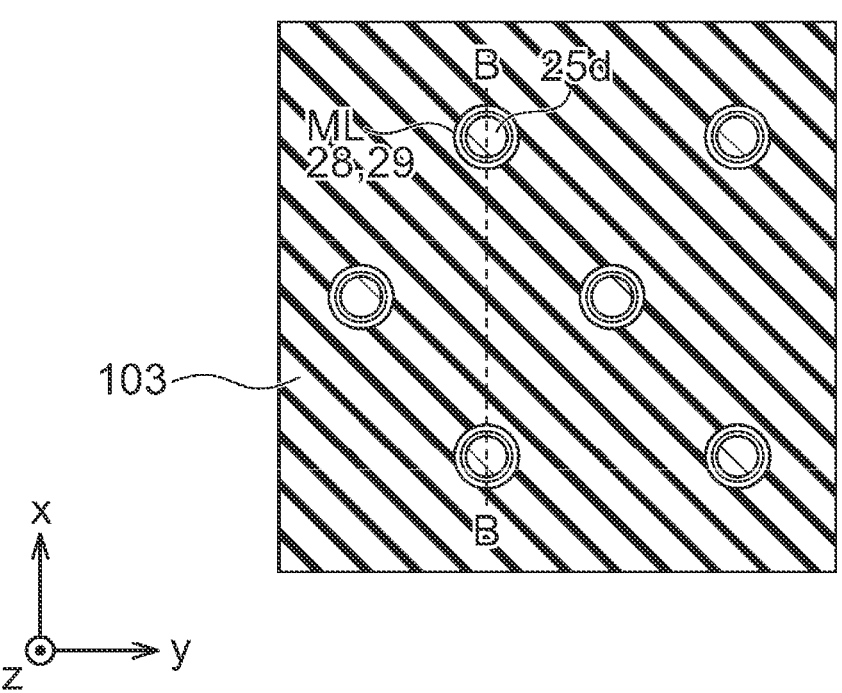
FIG. 17A is a plan view showing aspects related to a manufacturing method for a magnetic memory according to a first embodiment.
Figure 17B:
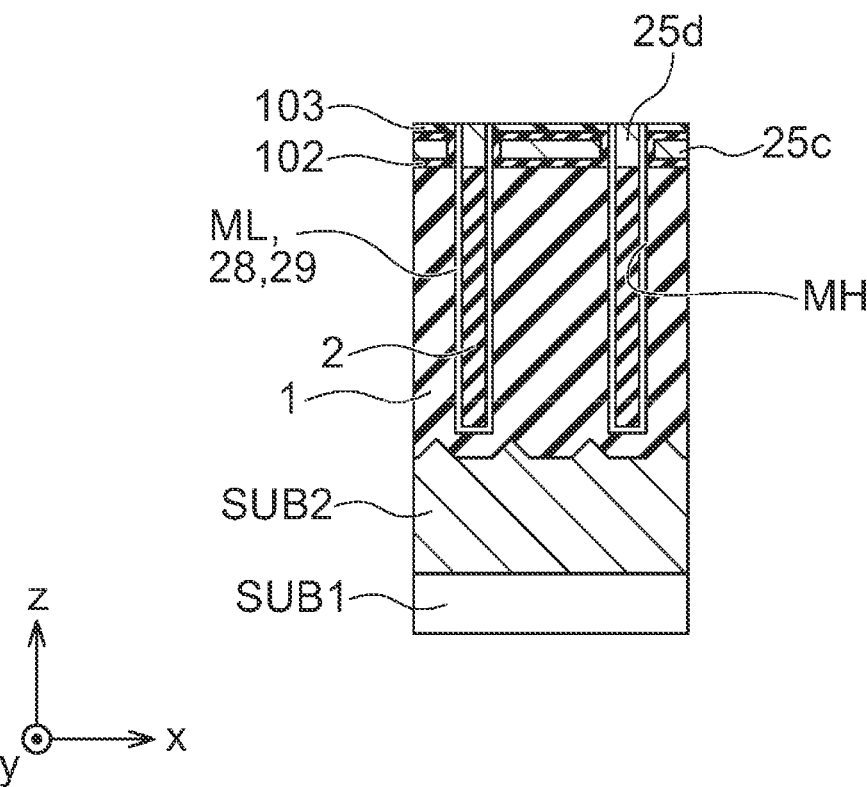
FIG. 17B is a cross-sectional view showing aspects related to a manufacturing method for a magnetic memory according to a first embodiment.

Next, a portion of the non-magnetic insulator 2 is etched back from the side of the surface F1. As a result, the upper end of the non-magnetic insulator 2 is recessed to a position lower than the yoke 25c in the z direction (position closer to the non-magnetic insulating layer 1 than the yoke 25c). Next, the material of the yoke 25d is embedded inside the magnetic member $ML_{ij}$ in the memory hole MH. Using a CMP method or the like, the material of the yoke 25d can be polished until the mask material 103 is exposed. As a result, as shown in FIGS. 17A and 17B, the yoke 25d is left in a self-aligned manner on the non-magnetic insulator 2 inside the magnetic member $ML_{ij}$. A magnetic conductive material, for example, is used as the material of the yoke 25d. In this manner, the yoke 25d is formed in a self-aligned manner in a pole shape on the non-magnetic insulator 2 inside the magnetic member $ML_{ij}$ without using lithography technology. Therefore, although the inner diameter of the memory hole MH is small, the yoke 25d can be easily formed inside the magnetic member $ML_{ij}$.

Next, a non-magnetic insulating layer 3a is formed on the mask material 103, and the material of the field line FL is formed on the non-magnetic insulating layer 3a. A low resistance metal material such as copper or tungsten can be used for the field line FL.

Figure 18A:
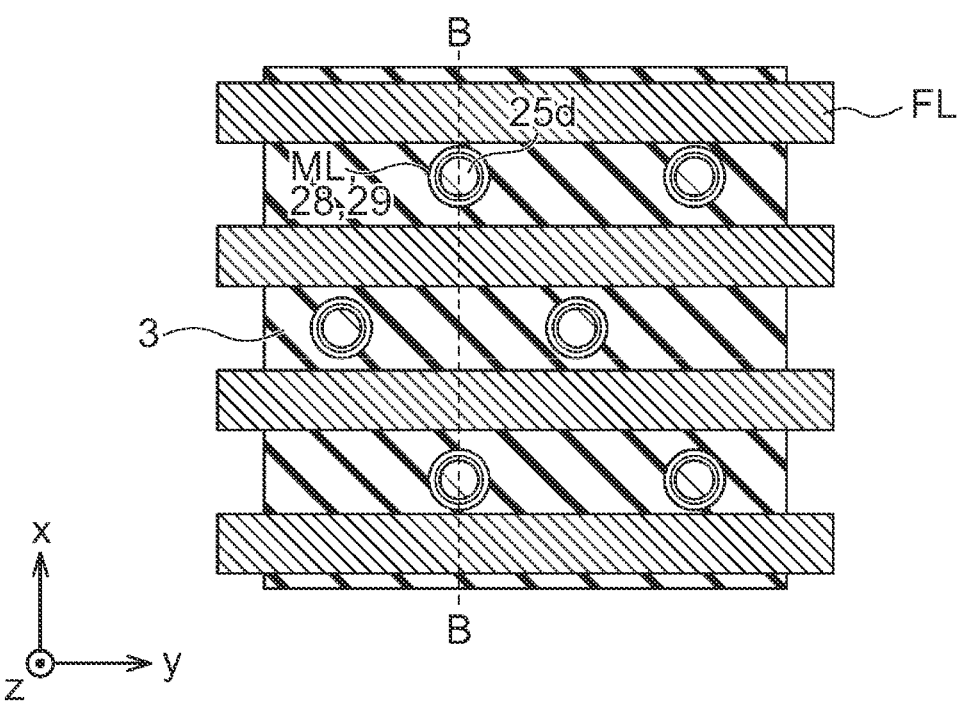
FIG. 18A is a plan view showing aspects related to a manufacturing method for a magnetic memory according to a first embodiment.

Next, using lithography technology and etching technology, the material of the field lines FL is processed into an appropriate shape. As a result, a plurality of field lines FL are formed above the surface F1 of the non-magnetic insulating layer 1 to be spaced apart from the magnetic members $ML_{ij}$. As shown in FIG. 18A, the plurality of field lines FL extend in the y direction and are disposed adjacent to each other in the x direction. The memory hole MH and the magnetic member ML are positioned between the two adjacent field lines FL in plan view from the z direction. The memory holes MH and the magnetic members ML are not provided directly under a field line FL.

Figure 18B:
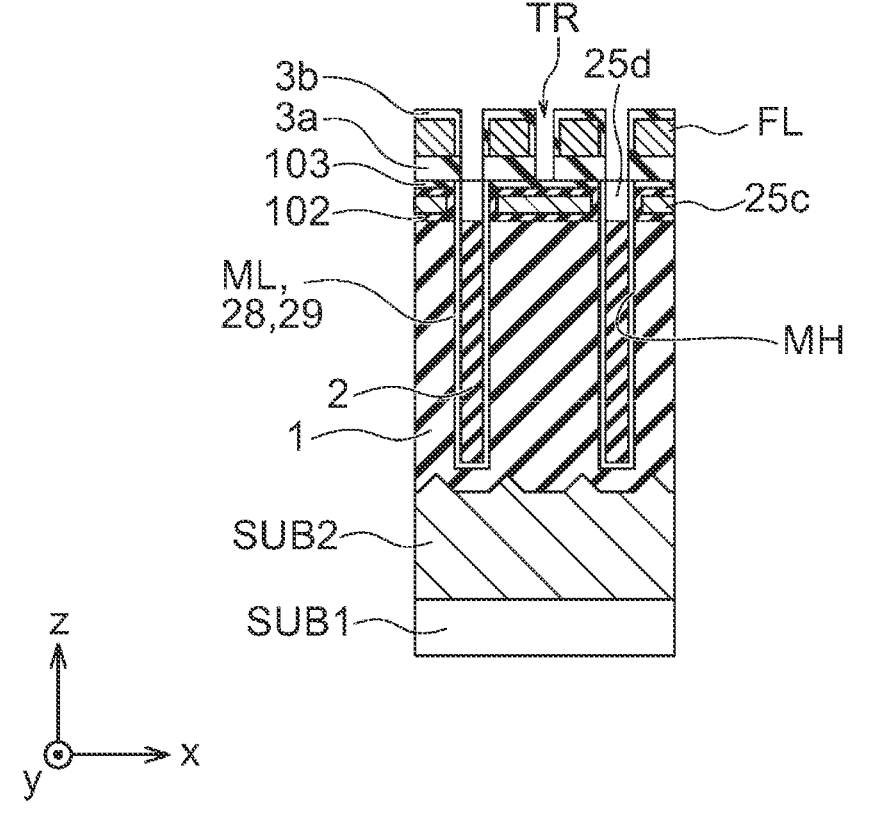
FIG. 18B is a cross-sectional view showing aspects related to a manufacturing method for a magnetic memory according to a first embodiment.

Next, a non-magnetic insulating layer 3b is formed on the upper surfaces and the side surfaces of the field lines FL. Next, the non-magnetic insulating layer 3a is etched back to expose the surface of the yoke 25d between the two adjacent field lines FL. As a result, the structure shown in FIGS. 18A and 18B is obtained. A trench TR is formed parallel to the field lines FL between adjacent pairs of field lines FL. In plan view from the z direction, the trench TR has an elongated shape of a line shape extending in the y direction along with the field line FL, and the trenches TR are alternately arranged with the field lines FL in the x direction. The trench TR is provided on memory holes MH and magnetic members ML. As shown in FIG. 18B, the periphery of the field line FL is covered with the non-magnetic insulating layers 3a and 3b. The non-magnetic insulating layers 3a and 3b form (correspond to) the non-magnetic insulating layer 3 shown in FIG. 7.

Figure 19A:
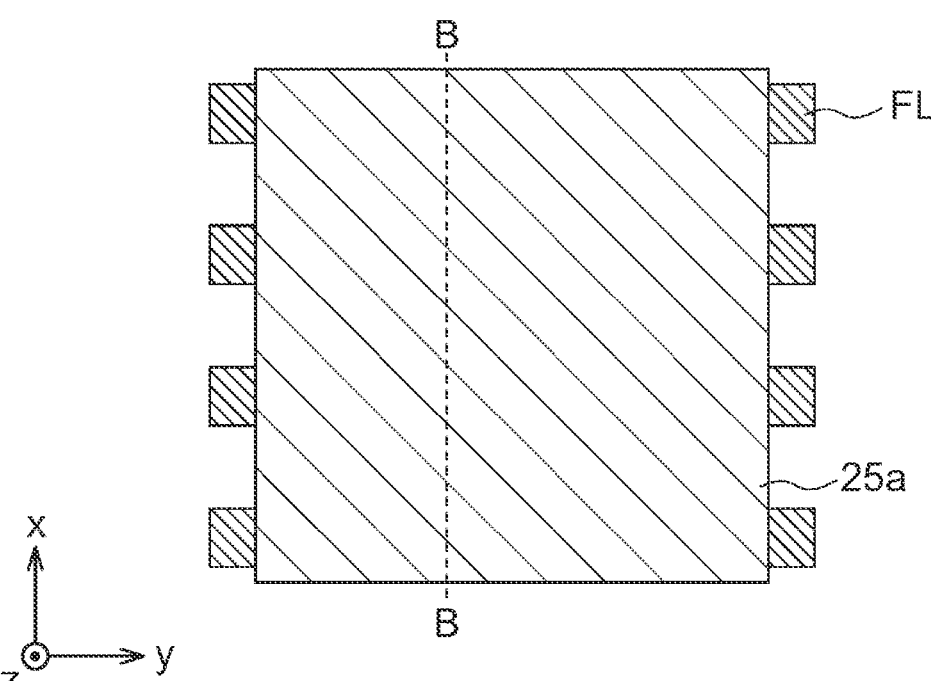
FIG. 19A is a plan view showing aspects related to a manufacturing method for a magnetic memory according to a first embodiment.
Figure 19B:
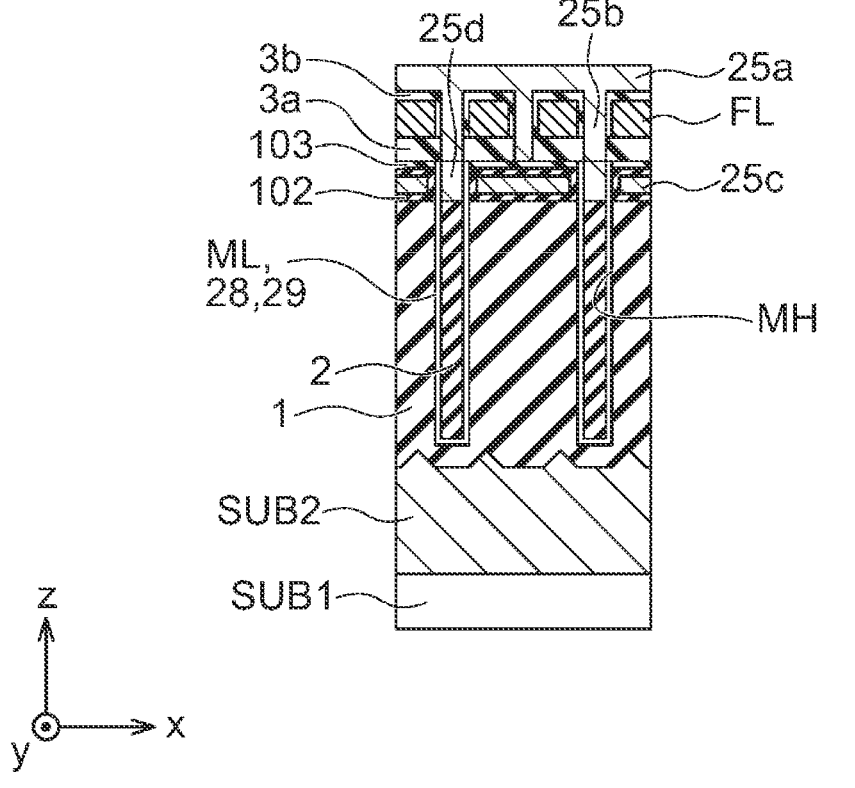
FIG. 19B is a cross-sectional view showing aspects related to a manufacturing method for a magnetic memory according to a first embodiment.
Figure 20:
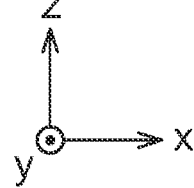
FIG. 20 is a cross-sectional view showing an example of a completed structure of a magnetic memory according to an embodiment.

Next, as shown in FIGS. 19A and 19B, the material of the yoke 25b is embedded in the trenches TR between the adjacent field lines FL. The material of the yoke 25a is also deposited on the non-magnetic insulating layer 3b. A magnetic material, for example, is used as the material of the yokes 25a and 25b. As a result, the material of the yoke 25b is embedded between two adjacent field lines FL in a self-aligned manner. In the first embodiment, the lithography technology is not used for forming the yoke 25b other than for forming the trenches TR.

The yoke 25b is formed along the field line FL between the two adjacent field lines FL, corresponding in position to the trench TR. In plan view from the z direction, the yoke 25b has an elongated shape extending in the y direction along the field line FL, and is alternately arranged with the field line FL in the x direction. That is, the yoke 25b is formed in a line-and-space shape similar to the field lines FL. Further, the yoke 25b is provided on the memory hole MH and the magnetic member ML. The yoke 25b is electrically and magnetically coupled to the plurality of yokes 25d arranged in the y direction.

The yoke 25a is provided on the yokes 25b and the non-magnetic insulating layer 3b. The yoke 25a may be formed of the same material as the yoke 25b and in the same process as the yokes 25b. In other examples, the yoke 25a may be formed of a magnetic material different from the material of the yokes 25b. The yoke 25a is provided above the yokes 25b and the field lines FL. As shown in FIG. 19A, the yoke 25a overlaps the yokes 25b and the field lines FL in plan view from the z direction.

The yokes 25a, 25b, and 25d are electrically and magnetically coupled. The yoke 25c is electrically separated from the yokes 25a, 25b, and 25d by the insulating layer 28 of FIG. 4 or 5, but is magnetically coupled. Therefore, the magnetic circuit 25 configured with the yokes 25a to 25d can concentrate the magnetic flux of the field line FL on the magnetic member ML in the magnetic gap G between the yoke 25c and the yoke 25d.

Next, as shown in FIG. 20, the plate electrode PL is formed on the yoke 25a. A low resistance metal material such as copper or tungsten can be used for the plate electrode PL. Next, an insulating layer 104 is formed on the plate electrode PL. An insulating material such as a silicon oxide film, for example, is used for the insulating layer 104.

Next, the supporting substrate SUB1 and the non-magnetic layer SUB2 can be removed. Next, the magnetoresistive element $14_{ij}$ and the vertical thin film transistor $18_{ij}$ are formed on a back surface F2 opposite to the surface F1 of the non-magnetic insulating layer 1.

After that, a complementary metal oxide semiconductor (CMOS) chip 105 can be bonded to a bonding surface FB on the back side of the vertical thin film transistor $18_{ij}$. As a result, the structure of the magnetic memory shown in FIG. 20 is formed. The CMOS chip 105 has, for example, a CMOS field effect transistor (CMOSFET) on a silicon substrate, and controls the magnetic memory through the vertical thin film transistors $18_{ij}$. The CMOS chip 105 is formed separately from the rest of the magnetic memory.

In the first embodiment, the yokes 25a to 25d are formed by a self-aligned method without the direct formation by using lithography. For example, the yoke 25d is embedded on the non-magnetic insulator 2 recessed inside the magnetic member ML, and is formed in a self-aligned manner in the magnetic member ML. The yoke 25b is embedded in the trench TR formed between the two adjacent field lines FL and formed in a self-aligned manner between the field lines FL.

When the yoke 25b is formed in a columnar shape on the yoke 25d, it is necessary to use lithography technology and etching technology. However, as described above, the inner diameter of the memory hole MH is approximately 40 nm, and the interval between the adjacent memory holes MH is approximately 100 nm. It is difficult to precisely form the yoke 25b with such a small diameter on the yoke 25d at narrow intervals by lithography.

In contrast, in the present embodiment, the yoke 25d is embedded on the non-magnetic insulator 2 recessed inside the magnetic member ML in a self-aligned manner in the magnetic member ML. Therefore, the yokes 25d of a pole shape having a small diameter can be disposed at narrow intervals without using lithography technology and etching technology. The yoke 25b is formed between the two adjacent field lines FL in a self-aligned manner in an elongated shape of a line (or plate shape or rod shape). Therefore, the yokes 25b can be disposed at narrow intervals without using lithography technology and etching technology. Therefore, it is possible to easily form a yoke structure that can be small in size without requiring certain lithography processes and etching technology.

The yoke 25b faces the side surface of a field line FL and covers the side surface. Therefore, when a current is passed through the field lines FL, the magnetic circuit 25 can efficiently collect the magnetic flux of the field lines FL. This leads to an improvement in write efficiency to the magnetic member ML.

While certain embodiments have been described, these embodiments have been presented by way of example only, and are not intended to limit the scope of the disclosure. Indeed, the novel embodiments described herein may be embodied in a variety of other forms; furthermore, various omissions, substitutions and changes in the form of the embodiments described herein may be made without departing from the spirit of the disclosure. The accompanying claims and their equivalents are intended to cover such forms or modifications as would fall within the scope and spirit of the disclosure.

What is claimed is:

1. A magnetic memory, comprising:
a plurality of first magnetic members, each extending in a first direction and having a first end portion and a second end portion;
a plurality of first wirings extending in a second direction intersecting the first direction and spaced from each other in a third direction intersecting the first and second directions, the second end portion of one of the plurality of first magnetic members being between adjacent first wirings in plan view from the first direction;
a second magnetic member including a first portion above the plurality of first wirings in the first direction, a second portion extending in the second direction between adjacent first wirings and electrically coupled to the first portion, a third portion below the plurality of first wirings in the first direction, and a fourth portion with a part inside the second end portion of the one of the plurality of first magnetic members and electrically coupled to the second portion; and
a third wiring extending in the third direction and electrically coupled to the first end portions of at least one of the plurality of first magnetic members.

2. The magnetic memory according to claim 1, wherein the second portion faces the side surfaces of adjacent first wirings and extends in the second direction in parallel with the adjacent first wirings.

3. The magnetic memory according to claim 1, wherein
the first portion faces upper surfaces of the plurality of first wirings,
the third portion faces bottom surfaces of the plurality of first wirings and has a portion surrounding the second end portions of the first magnetic members, and
the fourth portion has a pole shape extending in the first direction.

4. The magnetic memory according to claim 1, wherein the first portion has a plate shape and extends in the second and third directions.

5. The magnetic memory according to claim 1, wherein the third portion has a plate shape and extends in the second and third directions, the third portion further including holes therein in positions corresponding to the second end portions of the plurality of first magnetic members.

6. The magnetic memory according to claim 1, wherein the plurality of first wirings and the second portion are alternately disposed in the third direction.

7. The magnetic memory according to claim 1, wherein a distance between the third portion and the fourth portion is less than a distance between the third portion and the second portion.

8. The magnetic memory according to claim 1, wherein the second portion is electrically coupled to the fourth portion.

9. The magnetic memory according to claim 1, wherein the third portion is electrically separated from the first portion.

10. The magnetic memory according to claim 1, further comprising:
a plurality of magnetoresistive elements each having a first end electrically coupled to one of the first end portions of the plurality of first magnetic members.

11. The magnetic memory according to claim 10, further comprising:
a switching element between one of the plurality of magnetoresistive elements and the third wiring.

12. A magnetic memory, comprising:
a plurality of magnetic cylinders extending in a first direction and arrayed in columns along a second direction and rows along a third direction;
a plurality of field lines extending in the second direction and spaced from one another in the third direction;
a magnetic yoke including a first portion above the field lines in the first direction, a second portion extending in the second direction between adjacent field lines, a third portion below the plurality of field lines in the first direction, and a plurality of fourth portions, each fourth portion having a part inside an upper end portion of one of the plurality of magnetic cylinders, the fourth portions being electrically coupled to the second portion; and
a plurality of bit lines extending in the third direction and spaced from one another in the second direction, each magnetic cylinder having a lower end electrically coupled to one of the plurality of bit lines.

13. The magnetic memory according to claim 12, wherein the plurality of field lines and the second portion are alternately disposed in the third direction.

14. The magnetic memory according to claim 12, wherein the third portion is electrically separated from the first portion.

15. The magnetic memory according to claim 12, further comprising:
a plurality of magnetoresistive elements each having a first end electrically coupled to one of the lower end portions of the plurality of magnetic cylinders.

16. The magnetic memory according to claim 15, further comprising:
a switching element between one of the plurality of magnetoresistive elements and one of the plurality of bit lines.

17. The magnetic memory according to claim 12, further comprising:
an insulating film between the third portion and the magnetic cylinders.

18. The magnetic memory according to claim 17, further comprising:
a non-magnetic conductive film between one of the fourth portions and one of the magnetic cylinders.

19. The magnetic memory according to claim 12, further comprising:
a non-magnetic conductive film between one of the fourth portions and one of the magnetic cylinders.

* * * * *